US008247315B2

(12) United States Patent
Furuno et al.

(10) Patent No.: US 8,247,315 B2
(45) Date of Patent: Aug. 21, 2012

(54) PLASMA PROCESSING APPARATUS AND METHOD FOR MANUFACTURING SEMICONDUCTOR DEVICE

(75) Inventors: Makoto Furuno, Kanagawa (JP); Tetsuo Sugiyama, Kanagawa (JP); Taichi Nozawa, Kanagawa (JP); Mitsuhiro Ichijo, Kanagawa (JP); Ryota Tajima, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 128 days.

(21) Appl. No.: 12/400,844

(22) Filed: Mar. 10, 2009

(65) Prior Publication Data

US 2009/0233425 A1    Sep. 17, 2009

(30) Foreign Application Priority Data

Mar. 17, 2008  (JP) ................................ 2008-068480

(51) Int. Cl.
*H01L 21/20* (2006.01)
(52) U.S. Cl. .................... 438/482; 438/485; 438/488
(58) Field of Classification Search .................. None
See application file for complete search history.

(56) References Cited

U.S. PATENT DOCUMENTS

| | | | |
|---|---|---|---|
| 4,409,134 A | 10/1983 | Yamazaki | |
| 4,971,667 A | 11/1990 | Yamazaki et al. | |
| 5,159,184 A | 10/1992 | Egawa et al. | |
| 5,256,509 A | 10/1993 | Hayashi et al. | |
| 5,453,858 A | 9/1995 | Yamazaki | |
| 5,540,781 A * | 7/1996 | Yamagami et al. | 118/723 E |
| 5,571,578 A | 11/1996 | Kaji et al. | |
| 5,591,987 A | 1/1997 | Yamazaki et al. | |
| 5,626,922 A | 5/1997 | Miyanaga et al. | |
| 5,648,662 A | 7/1997 | Zhang et al. | |
| 5,701,167 A | 12/1997 | Yamazaki | |
| 5,723,034 A * | 3/1998 | Ohmi | 204/192.23 |
| 5,766,989 A | 6/1998 | Maegawa et al. | |
| 5,811,328 A | 9/1998 | Zhang et al. | |
| 5,825,050 A | 10/1998 | Hirakawa | |
| 5,849,601 A | 12/1998 | Yamazaki | |

(Continued)

FOREIGN PATENT DOCUMENTS

EP    0473988 A    3/1992

(Continued)

OTHER PUBLICATIONS

Arai.T et al., "41.2: Micro Silicon Technology for Active Matrix Oled Display", SID Digest '07 : SID International Symposium Digest of Technical Papers, 2007, vol. 38, pp. 1370-1373.

(Continued)

*Primary Examiner* — Scott B Geyer
(74) *Attorney, Agent, or Firm* — Eric J. Robinson; Robinson Intellectual Property Law Office, P.C.

(57) ABSTRACT

By an evacuation unit including first and second turbo molecular pumps connected in series, the ultimate pressure in a reaction chamber is reduced to ultra-high vacuum. By a knife-edge-type metal-seal flange, the amount of leakage in the reaction chamber is reduced. A microcrystalline semiconductor film and an amorphous semiconductor film are stacked in the same reaction chamber where the pressure is reduced to ultra-high vacuum. By forming the amorphous semiconductor film covering the surface of the microcrystalline semiconductor film, oxidation of the microcrystalline semiconductor film is prevented.

3 Claims, 19 Drawing Sheets

U.S. PATENT DOCUMENTS

| | | | |
|---|---|---|---|
| 6,023,075 | A | 2/2000 | Yamazaki |
| 6,057,005 | A * | 5/2000 | Nishimoto ............. 427/578 |
| 6,124,155 | A | 9/2000 | Zhang et al. |
| 6,166,399 | A | 12/2000 | Zhang et al. |
| 6,224,950 | B1 | 5/2001 | Hirata |
| 6,252,249 | B1 | 6/2001 | Yamazaki |
| 6,306,213 | B1 | 10/2001 | Yamazaki |
| 6,335,213 | B1 | 1/2002 | Zhang et al. |
| 6,482,752 | B1 | 11/2002 | Yamazaki et al. |
| 6,727,522 | B1 | 4/2004 | Kawasaki et al. |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 6,849,123 | B2 | 2/2005 | Niino et al. |
| 7,061,014 | B2 | 6/2006 | Hosono et al. |
| 7,067,844 | B2 | 6/2006 | Yamazaki |
| 7,098,479 | B1 | 8/2006 | Yamazaki |
| 7,115,448 | B2 | 10/2006 | Tsujimura et al. |
| 7,115,902 | B1 | 10/2006 | Yamazaki |
| 7,125,588 | B2 | 10/2006 | Miyanaga et al. |
| 7,148,542 | B2 | 12/2006 | Yamazaki et al. |
| 7,507,991 | B2 | 3/2009 | Zhang et al. |
| 7,576,360 | B2 | 8/2009 | Yamazaki |
| 7,786,485 | B2 | 8/2010 | Dairiki et al. |
| 2003/0143821 | A1 | 7/2003 | Niino et al. |
| 2004/0045505 | A1 | 3/2004 | Higashikawa et al. |
| 2004/0188685 | A1 | 9/2004 | Lin et al. |
| 2005/0202653 | A1 * | 9/2005 | Joshi et al. ............. 438/479 |
| 2007/0072439 | A1 | 3/2007 | Akimoto et al. |
| 2007/0202667 | A1 * | 8/2007 | Asami et al. ............. 438/482 |
| 2008/0044962 | A1 | 2/2008 | Zhang et al. |
| 2008/0308807 | A1 | 12/2008 | Yamazaki et al. |
| 2009/0047760 | A1 | 2/2009 | Yamazaki et al. |
| 2009/0047761 | A1 * | 2/2009 | Yamazaki et al. ......... 438/158 |
| 2009/0047774 | A1 * | 2/2009 | Yamazaki ............... 438/479 |
| 2009/0047775 | A1 * | 2/2009 | Yamazaki et al. ......... 438/488 |
| 2009/0218576 | A1 | 9/2009 | Dairiki et al. |
| 2010/0044701 | A1 | 2/2010 | Sano et al. |
| 2010/0051937 | A1 | 3/2010 | Kaji et al. |

FOREIGN PATENT DOCUMENTS

| | | | |
|---|---|---|---|
| JP | 60-098680 | A | 6/1985 |
| JP | 60-198861 | A | 10/1985 |
| JP | 61-087371 | A | 5/1986 |
| JP | 04-242724 | A | 8/1992 |
| JP | 04-242724 | A | 8/1992 |
| JP | 06-077483 | A | 3/1994 |
| JP | 07-122621 | A | 5/1995 |
| JP | 08-264794 | A | 10/1996 |
| JP | 11-121761 | A | 4/1999 |
| JP | 11-505377 | A | 5/1999 |
| JP | 2000-150888 | A | 5/2000 |
| JP | 2000-150900 | A | 5/2000 |
| JP | 2001-007024 | A | 1/2001 |
| JP | 2001-127296 | A | 5/2001 |
| JP | 3201492 | | 8/2001 |
| JP | 2002-246605 | A | 8/2002 |
| JP | 2004-103957 | A | 4/2004 |
| JP | 2004-319920 | A | 11/2004 |
| JP | 2005-049832 | | 2/2005 |
| JP | 2005-049832 | A | 2/2005 |
| JP | 2005-167051 | A | 6/2005 |
| JP | 2007-005508 | A | 1/2007 |
| JP | 2007-035964 | A | 2/2007 |
| JP | 2007-049171 | A | 2/2007 |
| JP | 2007-073698 | A | 3/2007 |
| JP | 2007-073705 | A | 3/2007 |
| JP | 2007-096055 | A | 4/2007 |
| JP | 2007-123861 | A | 5/2007 |
| JP | 2008-218495 | A | 9/2008 |
| JP | 2008-235871 | A | 10/2008 |

OTHER PUBLICATIONS

Lee.C et al., "How to Achieve High Mobility Thin Film Transistors by Direct Deposition of Silicon Using 13.56 Mhz RF PECVD?", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities", Appl. Phys. Lett.(Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition", Appl. Phys. Lett.(Applied Physics Letters), May 24, 2005, vol. 86, pp. 222106-1-222106-3.

Lee.C et al., "High-Mobility N-Channel and P-Channel Nanocrystalline Silicon Thin-Film Transistors", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements", Appl. Phys. Lett.(Applied Physics Letters), Sep. 12, 2007, vol. 91, No. 11, pp. 113511-1-113511-3.

Lee.C et al., "Stability of NC-SI:H TFTS With Silicon Nitride Gate Dielectric", IEEE Transactions on Electron Devices, 2007, vol. 54, No. 1, pp. 45-51.

Sazonov.A et al., "Low-Temperature Materials and Thin Film Transistors for Flexible Electronics", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric", J. Appl. Phys. (Journal of Applied Physics), Sep. 28, 2007, vol. 102, No. 6, pp. 064512-1-064512-7.

Lee.C et al., "Top-Gate TFTS Using 13.56Mhz PECVD Microcrystalline Silicon", IEEE Electron Device Letters, Sep. 5, 2005, vol. 26, No. 9, pp. 637-639.

Lee.C et al., "Postdeposition Thermal Annealing and Material Stability of 75°C. Hydrogenated Nanocrystalline Silicon Plasma-Enhanced Chemical Vapor Deposition Films", J. Appl. Phys. (Journal of Applied Physics), Aug. 4, 2005, vol. 98, No. 3, pp. 034305-1-034305-7.

Chiang.H et al., "High Mobility Transparent Thin-Film Transistors With Amorphous Zinc Tin Oxide Channel Layer", Appl. Phys. Lett. (Applied Physics Letters), 2005, vol. 86, No. 1. pp. 013503-1-013503-3.

Miyasako.T et al., "Ferroelectric-Gate Thin-Film Transistors Using Indium-Tin-Oxide Channel With Large Controllability", Appl. Phys. Lett. (Applied Physics Letters), 2005, vol. 86, No. 16. pp. 162902-1-162902-3.

Nishii.J et al., "High-Mobility Field-Effect Transistors Based on Single-Crystalline ZnO Channels", JPN. J. Appl. Phys. (Japanese Journal of Applied Physics), Sep. 9, 2005, vol. 44, No. 38, pp. L1193-L1195.

Minami.T et al., "Highly Transparent and Conductive Zinc-Stannate Thin Films Prepared by RF Magnetron Sputtering", JPN. J. Appl. Phys. (Japanese Journal of Applied Physics), Dec. 1, 1994, vol. 33, No. 12A, pp. L1693-L1696.

* cited by examiner 50   51b  51a  52a 52b 54  53 light transmittance light transmittance

PLASMA PROCESSING APPARATUS AND METHOD FOR MANUFACTURING SEMICONDUCTOR DEVICE

BACKGROUND OF THE INVENTION

1. Field of the Invention

The present invention relates to a method for manufacturing a semiconductor device which has a circuit including a thin film transistor (hereinafter also referred to as a TFT) using a semiconductor film. In addition, the present invention relates to a plasma processing apparatus for a plasma CVD method used in a process for forming a thin film in manufacturing a semiconductor device. The present invention further relates to a film formation method which uses the plasma processing apparatus. For example, the present invention relates to a photoelectric conversion device typified by a solar cell or a sensor, an electro-optical device typified by a liquid crystal display panel, a light-emitting device including a light-emitting element, or an electronic device equipped with a wireless chip including an antenna as a component.

In this specification, a semiconductor device refers to all types of devices which can function by utilizing semiconductor characteristics. An electro-optical device, a light-emitting device, a semiconductor circuit, and an electronic device are all included in the category of the semiconductor device.

2. Description of the Related Art

In recent years, a technique for forming a thin film transistor using a semiconductor thin film (with a thickness of approximately several tens to several hundreds of nanometers) which is formed over a substrate having an insulating surface has attracted attention. A thin film transistor is widely applied to electronic devices such as an IC and an electro-optical device and has been rapidly developed particularly as a switching element for an image display device.

By a plasma CVD method, which is a typical film formation method, for example, an amorphous semiconductor film, a polycrystalline semiconductor film, a microcrystalline semiconductor film, and the like are deposited.

As a switching element for an image display device, a thin film transistor using an amorphous semiconductor film or a thin film transistor using a polycrystalline semiconductor film is known. As a method for forming a polycrystalline semiconductor film over a glass substrate, there is known a technique in which a pulsed excimer laser beam is shaped into a linear laser beam by an optical system and an amorphous silicon film formed over a glass substrate is crystallized by being scanned and irradiated with the linear laser beam.

Also, as a switching element for an image display device, a thin film transistor using a microcrystalline semiconductor film is known (Reference 1: Japanese Published Patent Application No. H4-242724 and Reference 2: Japanese Published Patent Application No. 2005-49832).

So far, a production technique by which one mother glass substrate is cut into separate sections to obtain a plurality of panels so that mass production can be efficiently performed has been employed. The size of the mother glass substrate has increased from 300 mm×400 mm for the first generation in the beginning of 1990s to 680 mm×880 mm or 730 mm×920 mm for the fourth generation in 2000s. The production technique has progressed so that a number of display panels can be obtained from one substrate.

Further, as the substrate size has been increased as described above, demands on improvement in productivity and reduction in cost have been increased.

As a TFT structure which satisfies these demands, an inverted-staggered (bottom-gate) TFT structure has been mainstream.

In addition, in accordance with miniaturization of a semiconductor element, individual processes are required to be highly precise. In a semiconductor manufacturing process, a reaction-product film which is formed by reaction of a source gas by various methods (plasma, heat, light, or the like) is deposited over a substrate to be processed which is disposed in a chamber of a film formation apparatus. In particular, suppression of particles generated in the film formation apparatus is an important objective, and keeping the inside of the chamber clean is also critical to stabilize the process.

Reference 3 (Japanese Published Patent Application No. H7-122621) discloses a substrate processing apparatus in which a plurality of treatments such as formation of a thin film over a substrate are successively performed while keeping airtightness.

SUMMARY OF THE INVENTION

It is an object of the present invention to provide a method for manufacturing, with high productivity, a semiconductor device including a thin film transistor having high reliability in electric characteristics compared to a thin film transistor using an amorphous semiconductor film.

It is another object to provide a plasma processing apparatus by which a semiconductor film having crystallinity even in a film formation step, typically, a microcrystalline semiconductor film is formed and favorable film quality is realized.

In order to realize favorable film quality, it is important to reduce oxygen or nitrogen included in a film. Oxygen and nitrogen are elements that make part of a semiconductor layer n-type. These elements increase defect density in an amorphous semiconductor layer and decrease electric-field-effect mobility. Further, oxygen or nitrogen included in a film might be a factor of variation in electric characteristics of a TFT. Note that, conventionally, nitrogen has been called an inert gas in some cases and has been supposed to be an element which has no adverse effect on a chamber or a film even though it enters the chamber or the film in small amount. Nitrogen, which is one of atmospheric components, accounts for about 80% of the atmosphere.

In addition, there is a problem in that the surfaces of crystal grains of a microcrystalline semiconductor film that is obtained are easily oxidized. When crystal grains in a channel formation region are oxidized, oxide films are formed on the surfaces of the crystal grains and the oxide films become obstacles to the travel of carriers, which causes a problem in that electric characteristics of a thin film transistor are deteriorated.

In order to reduce oxygen or nitrogen included in a film which is obtained using a plasma processing apparatus, leakage into a chamber (reaction container) of the plasma processing apparatus is suppressed to achieve a high degree of vacuum.

In the plasma processing apparatus, in addition to a gas introduction system and an evacuation system, seal portions are provided at various positions, and a knife-edge-type metal-seal flange is used for hermetic sealing of at least one of the seal portions. It is important to reduce the total number of o-ring seals used for one chamber in order to reduce the amount of leakage. By using a knife-edge-type metal-seal flange, the amount of leakage can be drastically reduced. In a sealing structure using a knife-edge-type metal-seal flange, a conical seal edge of the flange presses a gasket to cause a cold flow in a material. Due to this cold flow, the outside surface of the gasket is pressed against a wall of the flange, whereby counterforce is generated. Therefore, a high pressure can be obtained. Defects on the seal surface and the gasket surface are removed by this high pressure, so that a highly reliable sealing structure can be obtained.

In addition, two turbo molecular pumps are connected in series to achieve a pressure of less than or equal to $10^{-5}$ Pa in a chamber. The ultimate pressure is lowered to $1\times10^{-7}$ Torr to $1\times10^{-10}$ Torr (approximately $1\times10^{-5}$ Pa to $1\times10^{-8}$ Pa) in an ultra-high vacuum (UHV) region so that a residue of an atmospheric component gas such as oxygen, nitrogen, or $H_2O$ in a vacuum chamber can be reduced as much as possible before film formation, a source gas with high purity is supplied, and substrate temperature in film formation is set at greater than or equal to 100° C. and less than 300° C.

A plasma processing apparatus in which leakage into the chamber is suppressed and a high degree of vacuum is achieved is used, so that a microcrystalline semiconductor film having favorable film quality can be formed. Further, preferably, a high-frequency power is used, which is obtained by setting a frequency of a power source connected to an electrode for generating glow discharge plasma to be a frequency in the VHF band of 30 MHz to 300 MHz with a wavelength of less than 10 m. By using the power source with a frequency in the VHF band, plasma temperature can be reduced and plasma density can be increased.

Alternatively, a microcrystalline semiconductor film having favorable film quality may be formed by supplying two or more kinds of high-frequency powers with different frequencies to the electrode for generating glow discharge plasma. A first high-frequency power is a power in a frequency band in which an effect of a surface standing wave is not exhibited, and a high-frequency with a wavelength of about greater than or equal to 10 m is employed. Then, a second high-frequency power with a shorter wavelength than that of the first high-frequency power is applied to the first high-frequency power. A difference in frequencies between the two power sources that are used is preferably large so as to reduce an effect of a surface standing wave.

An effect of a surface standing wave refers to a phenomenon that electric field intensity has a wide distribution by the increase in frequency of the power source connected to the electrode for generating glow discharge plasma and the increase in maximum size of the surface of the electrode for generating glow discharge plasma. When a mother glass, i.e., a glass substrate becomes larger, a plasma processing apparatus for forming a film over the large glass substrate also comes to have a larger electrode area. In this case, the size of the electrode of the plasma processing apparatus is close to the wavelength of a frequency of a high-frequency power source, approximately from when the glass substrate with the size of the sixth generation is used. For example, the wavelength is 1100 mm at a power source frequency of 27 MHz; moreover, the wavelength is 500 mm at 60 MHz and 250 mm at 120 MHz. In such cases, the effect of a surface standing wave becomes pronounced and the plasma density distribution in the reaction chamber of the plasma processing apparatus becomes uneven. Consequently, a problem such as degradation of evenness in quality and thickness of a thin film formed over the glass substrate arises.

By applying high-frequency powers with different frequencies (different wavelengths), which are superposed on each other, to the electrode of the plasma processing apparatus, density of plasma can be increased and the effect of a surface standing wave can be reduced, so that a thin film that is uniform and has good film quality can be formed over a large-area substrate with a long side of over 2000 mm.

Since two or more high-frequency power sources with different frequencies are connected to the electrode for generating glow discharge plasma, a high-frequency cut filter is provided for each of the high-frequency power sources so that interference between the power sources can be prevented. The high-frequency cut filter is a circuit including at least a variable capacitor and is disposed between a matching box and the electrode. For example, when two high-frequency power sources are used, a first high-frequency power source is connected to a first matching box, the first matching box is connected to a first high-frequency cut filter, and the first high-frequency cut filter is connected to an electrode. In addition, a second high-frequency power source is connected to a second matching box, the second matching box is connected to a second high-frequency cut filter, and the second high-frequency cut filter is connected to the electrode. The first high-frequency cut filter allows passage of a signal with a high-frequency from the first high-frequency power source therethrough and blocks a signal with a high-frequency from the second high-frequency power source. In addition, the second high-frequency cut filter allows passage of a signal with a high-frequency from the second high-frequency power source therethrough and blocks a signal with a high-frequency from the first high-frequency power source. Note that the high-frequency cut filter may be a parallel resonance circuit using a variable capacitor and a coil.

When a high-frequency power source with a frequency of greater than or equal to 60 MHz is used, electric conductivity of the electrode for generating glow discharge plasma is important. For example, with a frequency of a high-frequency power source of 60 MHz, plasma can be discharged also in the case of employing aluminum for a material of an upper electrode to which the high-frequency power source is connected and stainless steel for a material of a lower electrode. On the other hand, with a frequency of 100 MHz, aluminum is preferably used for each of the upper and lower electrodes. Further, a copper plate is preferably interposed between the upper electrode connected to the high-frequency power source and a heater in the case of a frequency of greater than or equal to 60 MHz so that plasma distribution can be improved. Furthermore, the copper plate may be interposed between the lower electrode and the heater, or the heater may be provided on the upper electrode side.

An embodiment of the invention disclosed in this specification is a plasma processing apparatus in which glow discharge plasma is generated in a reaction chamber and a reaction product is deposited over a substrate disposed in the reaction chamber. The plasma processing apparatus includes an electrode generating the glow discharge plasma in the reaction chamber, a first high-frequency cut filter and a second high-frequency cut filter which are electrically connected to the electrode, a first matching box electrically connected to the first high-frequency cut filter, a first high-frequency power source electrically connected to the first matching box, a second matching box electrically connected to the second high-frequency cut filter, and a second high-frequency power source electrically connected to the second matching box. A radio wave of a high-frequency wave output from the first high-frequency power source has a wavelength of greater than or equal to 10 m, a radio wave of a high-frequency wave output from the second high-frequency power source has a wavelength of less than 10 m, the first high-frequency cut filter blocks a high-frequency power from the second high-frequency power source, and the second high-frequency cut filter blocks a high-frequency power from the first high-frequency power source.

The plasma processing apparatus includes a unit (means) for evacuating the reaction chamber to vacuum. The unit for evacuating the reaction chamber to vacuum includes a first turbo molecular pump and a second turbo molecular pump which are connected in series. By this evacuation unit (means), the ultimate pressure in the reaction chamber is reduced to ultra-high vacuum. A hermetic sealing unit (means) of the reaction chamber includes a knife-edge-type metal-seal flange. By the knife-edge-type metal-seal flange, the amount of leakage in the reaction chamber is reduced.

The present invention solves at least one of the above problems.

In addition, there is a problem in that surfaces of crystal grains of a microcrystalline semiconductor film that is obtained are easily oxidized. To solve this problem, a microcrystalline semiconductor film and an amorphous semiconductor film are stacked in the same chamber. The amorphous semiconductor film which covers the surface of the microcrystalline semiconductor film prevents oxidation of the microcrystalline semiconductor film.

Another embodiment of the invention is a method for manufacturing a semiconductor device. The method includes the steps of introducing a first reaction gas into a reaction chamber, generating glow discharge plasma by applying a high-frequency power with a frequency of greater than or equal to 30 MHz and less than or equal to 300 MHz to an upper electrode of the reaction chamber, depositing a microcrystalline semiconductor film over a substrate disposed over a lower electrode of the reaction chamber, introducing a second reaction gas into the reaction chamber, generating glow discharge plasma by applying a high-frequency power with a frequency of greater than or equal to 30 MHz and less than or equal to 300 MHz to the upper electrode, and stacking an amorphous semiconductor film over the microcrystalline semiconductor film.

For example, a mixed gas including phosphine, a silane gas, and hydrogen is used for the first reaction gas, and a mixed gas of a silane gas and hydrogen is used for the second reaction gas, so that an $n^-$-type microcrystalline semiconductor film and an i-type amorphous semiconductor film can be stacked. In addition, the same gas can be used as the first and second reaction gases, and in that case, an i-type microcrystalline semiconductor film and an i-type amorphous semiconductor film can be stacked by changing film formation conditions such as the flow rate of the gas and power which is applied.

When a plasma processing apparatus in which two or more high-frequency power sources with different frequencies are connected to an electrode for generating glow discharge plasma is used, by switching between high-frequency power sources with different frequencies, a microcrystalline semiconductor film and an amorphous semiconductor film can be stacked in the same chamber.

Alternatively, after a microcrystalline semiconductor film is formed by applying high-frequency powers with different frequencies (different wavelengths), which are superposed on each other, to an electrode of a plasma processing apparatus, hydrogen plasma treatment is performed by applying a voltage only from a high-frequency power source with a frequency in the VHF band in the same chamber, whereby the film quality of the microcrystalline semiconductor film can be improved. In the microcrystalline semiconductor film, there are dangling bonds which are not chemically bonded to other atoms, and the dangling bonds become the recombination centers. By performing the hydrogen plasma treatment, the density of the recombination centers can be reduced.

Another embodiment of the invention is a method for manufacturing a semiconductor device. The method includes the steps of introducing a reaction gas into a reaction chamber; generating glow discharge plasma by applying a first high-frequency power with a first frequency of greater than or equal to 3 MHz and less than or equal to 30 MHz and a second high-frequency power with a second frequency of greater than or equal to 30 MHz and less than or equal to 300 MHz, which are superposed on each other, to an upper electrode of the reaction chamber; depositing a microcrystalline semiconductor film over a substrate disposed over a lower electrode of the reaction chamber; introducing hydrogen into the reaction chamber after depositing the microcrystalline semiconductor film; and performing plasma treatment on the microcrystalline semiconductor film by applying a third high-frequency power with a third frequency of greater than or equal to 30 MHz and less than or equal to 300 MHz to the upper electrode.

In this specification, a word which expresses up, down, side, horizontal, perpendicular, or the like indicates a direction based on a surface of a substrate in the case where a device is disposed on the surface of the substrate.

It is possible to provide a plasma processing apparatus by which a semiconductor film having crystallinity even in a film formation step, typically, a microcrystalline semiconductor film is formed and favorable film quality is realized. In addition, a semiconductor device including a thin film transistor having high reliability in electric characteristics compared to a thin film transistor using an amorphous semiconductor film can be manufactured with high productivity with the use of the semiconductor film having favorable film quality.

DETAILED DESCRIPTION OF THE INVENTION

Embodiments of the present invention will be described below.

Embodiment 1

Figure 1:
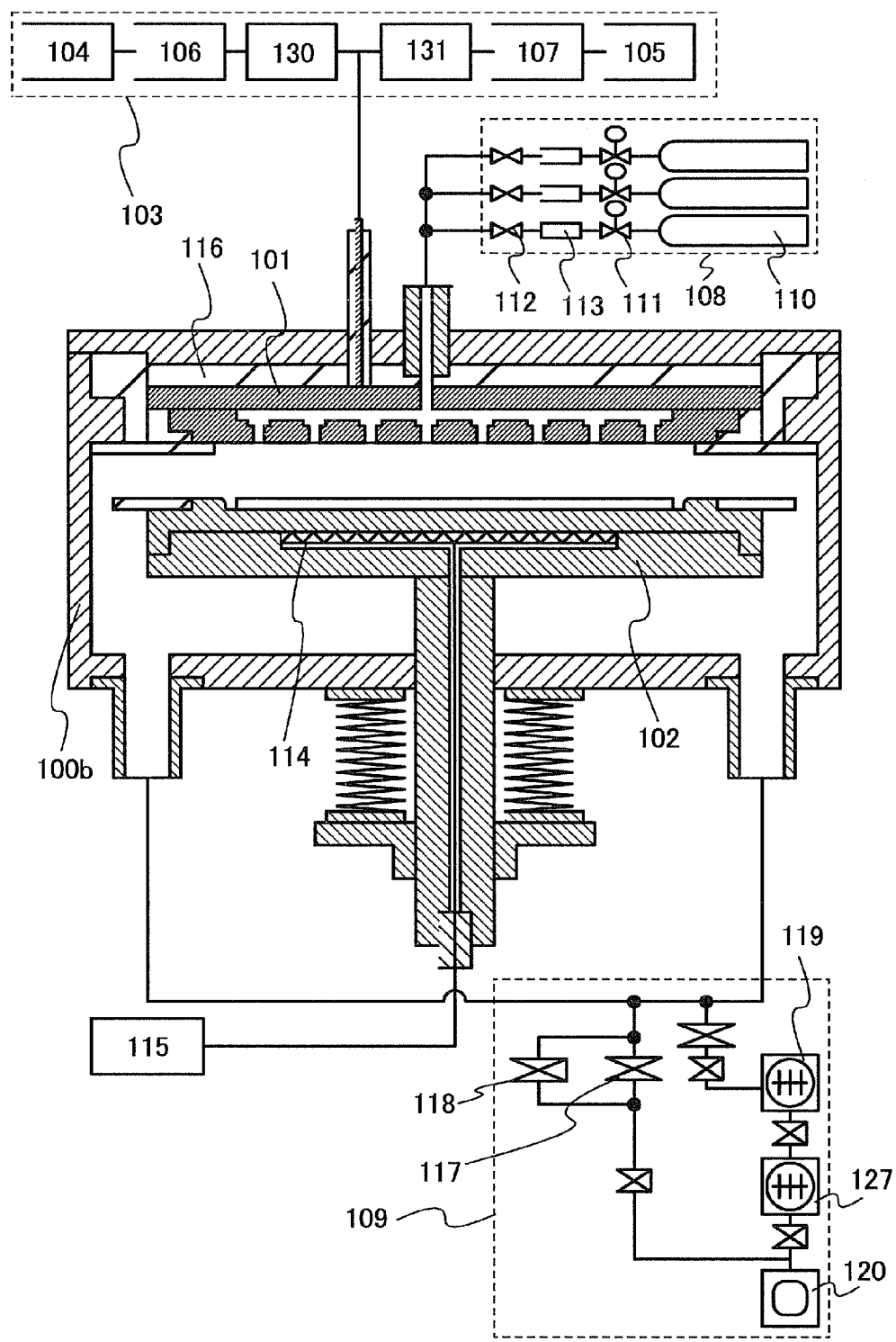
FIG. 1 is a cross-sectional view illustrating an example of a structure of a plasma processing apparatus.

FIG. 1 illustrates a structural example of a plasma processing apparatus where plural kinds of high-frequency powers are applied. A reaction chamber 100b is formed from a rigid material such as aluminum or stainless steel and can be evacuated to vacuum. In this embodiment, the reaction chamber is formed using stainless steel in order to increase its strength, and the inside thereof is coated with aluminum by thermal spraying. In addition, the reaction chamber can be disassembled for maintenance, and the inside thereof is regularly recoated with aluminum by thermal spraying. The reaction chamber 100b is provided with a first electrode (also referred to as an upper electrode) 101 and a second electrode (also referred to as a lower electrode) 102.

A high-frequency power supply unit (means) 103 is connected to the first electrode 101, a ground potential is applied to the second electrode 102, and a substrate can be placed on the second electrode 102. The first electrode 101 is insulated from the reaction chamber 100b by an insulating material 116, so that a high-frequency power does not leak. In the case where a ceramic material is used for the insulating material 116, it is difficult to use a knife-edge-type metal-seal flange and, thus, an O-ring seal is used for sealing the upper electrode.

Although the first electrode 101 and the second electrode 102 have a capacitively coupled (parallel plate) structure in FIG. 1, another structure such as an inductively coupled structure can also be employed as long as glow discharge plasma can be produced in the reaction chamber 100b by applying two or more kinds of high-frequency powers that are different from each other.

The high-frequency power supply unit (means) 103 includes a first high-frequency power source 104 and a second high-frequency power source 105, a first matching box 106 and a second matching box 107, and a first high-frequency cut filter 130 and a second high-frequency cut filter 131. High-frequency powers output from the first high-frequency power source 104 and the second high-frequency power source 105 are both supplied to the first electrode 101. On the output side of the first matching box 106, the first high-frequency cut filter 130 which blocks a high-frequency power output from the second high-frequency power source 105 is provided. In addition, on the output side of the second matching box 107, the second high-frequency cut filter 131 which blocks a high-frequency power output from the first high-frequency power source 104 is provided. By providing the first and second high-frequency cut filters 130 and 131, plasma can be stable or each of the high-frequency power sources can be prevented from being broken. For example, without a cut filter, a progressive wave with a frequency of 13.56 MHz flows as a reflected wave into a high-frequency power source with a frequency of 60 MHz, which could possibly lead a breakdown or an unstable oscillation of the high-frequency power source with a frequency of 60 MHz. Similarly, without a cut filter, a progressive wave with a frequency of 60 MHz flows as a reflected wave into a high-frequency power source with a frequency of 13.56 MHz, which could possibly lead a breakdown or an unstable oscillation of the high-frequency power source with a frequency of 13.56 MHz.

For a high-frequency power supplied from the first high-frequency power source 104, a high-frequency power with a wavelength of about greater than or equal to 10 m is used, that is, a high-frequency power with a frequency of 3 MHz to 30 MHz that is in the HF band, typically 13.56 MHz, is used. For a high-frequency power supplied from the second high-frequency power source 105, a high-frequency power with a frequency in the VHF band and with a wavelength of less than 10 m, in other words, a high-frequency power with a frequency of 30 MHz to 300 MHz is used.

The wavelength of the high-frequency power supplied from the first high-frequency power source 104 is three times or more longer than the length of one side of the first electrode 101. The wavelength of the high-frequency power supplied from the second high-frequency power source 105 is shorter than the wavelength of the high-frequency power supplied from the first high-frequency power source 104. A high-frequency power that does not exhibit an effect of a surface standing wave is supplied to the first electrode 101 to generate glow discharge plasma, and a high-frequency power in the VHF band is supplied in order to achieve high density of the glow discharge plasma, whereby a thin film that is uniform and has good film quality can be formed over a large-area substrate with a long side of over 2000 mm.

For example, in the case where a power source with a frequency of 13.56 MHz is used for the first high-frequency power source 104 and a power source with a frequency of 60 MHz is used for the second high-frequency power source 105, a variable capacitor with a capacitance of 10 pF to 100 pF (about 14.5 pF is employed here) is used for the first high-frequency cut filter 130 and a variable capacitor with a capacitance of 25 pF to 250 pF (about 63.8 pF is employed here) is used for the second high-frequency cut filter 131.

Figure 19:
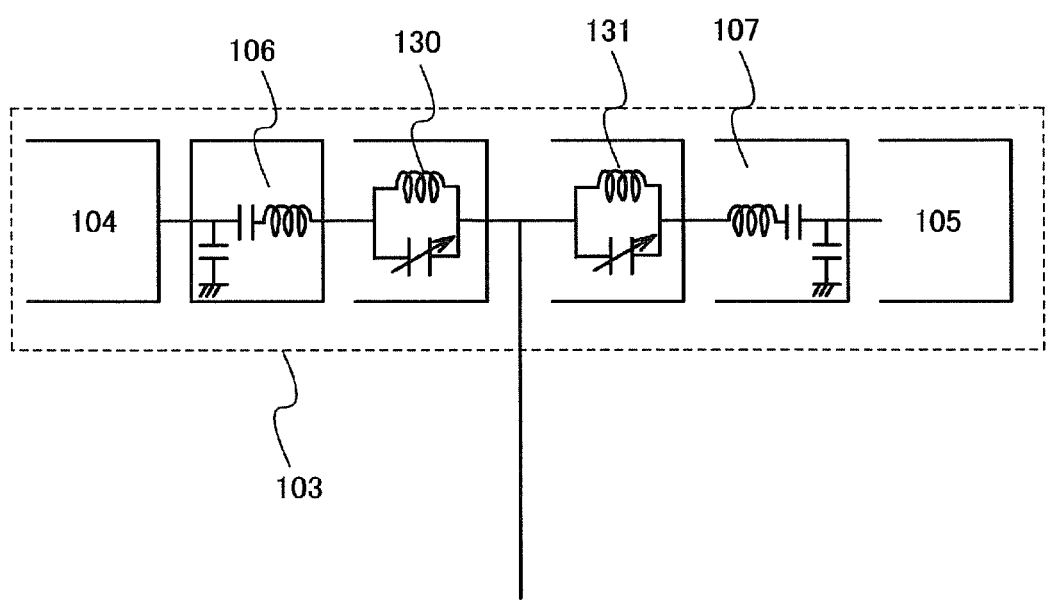
FIG. 19 is an equivalent circuit diagram illustrating an example of a parallel resonance circuit including a coil and a variable capacitor.

By further using a coil for each of the first and second high-frequency cut filters 130 and 131, a parallel resonance circuit using a coil and a variable capacitor may be formed. In such a case, for the first high-frequency cut filter 130, a coil with an inductance of 0.3 μH or 0.6 μH is used. In addition, for the second high-frequency cut filter 131, a coil with an inductance of 1.1 μH, 1.6 μH, or 2.1 μH is used. FIG. 19 illustrates an example in which a parallel resonance circuit is formed using a coil and a variable capacitor. In FIG. 19, an equivalent circuit of the first high-frequency cut filter 130, an equivalent circuit of the second high-frequency cut filter 131, an equivalent circuit of the first matching box 106, and an equivalent circuit of the second matching box 107 are illustrated as an example. Note that in the case of employing a configuration of FIG. 19, the coil may be selected as appropriate in accordance with a high-frequency power source which is used or the like.

The first electrode 101 is also connected to a gas supply unit (means) 108. The gas supply unit (means) 108 includes a cylinder 110 filled with a reaction gas, a pressure adjusting valve 111, a stop valve 112, a mass flow controller 113, and the like. In the reaction chamber 100b, a surface of the first electrode 101 that faces a substrate is processed into a form of a showerhead plate, and has many fine pores. A reaction gas that is supplied to the first electrode 101 passes through a hollow portion in the first electrode 101, and is supplied into the inside of the reaction chamber 100b through the pores.

An evacuation unit (means) 109 connected to the reaction chamber 100b has a function of vacuum evacuation and a function of controlling the reaction chamber 100b to be kept at a predetermined pressure in the case of supplying a reaction gas. The evacuation unit (means) 109 includes a butterfly valve 117, a valve 118, turbo molecular pumps 119 and 127, a dry pump 120, and the like. The turbo molecular pump 127 is connected to the dry pump 120 through a valve.

In the case of performing vacuum evacuation on the reaction chamber 100b, first, the roughing valve 118 is opened and the reaction chamber 100b is evacuated with the dry pump. Then, the valve 118 is closed and the butterfly valve 117 having a smaller diameter than the valve 118 is opened for vacuum evacuation. In the case of performing ultrahigh vacuum evacuation to obtain a pressure lower than $10^{-5}$ Pa in the reaction chamber 100b, the reaction chamber 100b is evacuated with the dry pump, the butterfly valve 117 is closed, and then vacuum evacuation is performed using the turbo molecular pumps 119 and 127 which are connected in series. Note that in FIG. 1, a valve for maintenance is provided between the turbo molecular pump 119 and the turbo molecular pump 127 for checking leakage, but the present invention is not particularly limited this example, and a valve for maintenance is not necessarily provided. The evacuation system illustrated in FIG. 1 is not limited to a particular structure as long as a plurality of turbo molecular pumps are provided in series with respect to an evacuation direction. In addition, the reaction chamber is preferably subjected to heat treatment to perform degassing of the inner wall.

A substrate heater 114, a temperature of which is controlled by a heater controller 115, is provided for the second electrode 102. In the case where the substrate heater 114 is provided inside the second electrode 102, a thermal conduction heating method is employed. For example, a sheathed heater is used for the substrate heater 114. A distance (also referred to as a gap) between the first electrode 101 and the second electrode 102 can be adjusted as appropriate. The distance between the electrodes is adjusted using a bellows in such a manner that the height of the second electrode 102 is changed in the reaction chamber 100b.

For example, in the case of forming an i-type microcrystalline silicon film using the plasma processing apparatus illustrated in FIG. 1, film formation conditions are set as follows: a high-frequency power source with a frequency of 60 MHz is used, 30 W of power is applied, the gap between the electrodes is 20 mm, the flow rate of a silane gas is 4 sccm, the flow rate of a hydrogen gas is 400 sccm, the pressure is 100 Pa, and the substrate temperature is 200° C.

In addition, for example, in the case of forming an n⁻-type microcrystalline silicon film, film formation conditions are set as follows: a high-frequency power source with a frequency of 60 MHz is used, 15 W of power is applied, the gap between the electrodes is 20 mm, the flow rate of a silane gas including phosphine at 100 ppm is 2 sccm, the flow rate of a hydrogen gas is 400 sccm, the pressure is 100 Pa, and the substrate temperature is 200° C.

Further, after forming any of the above microcrystalline semiconductor films, it is preferable to stack an amorphous semiconductor film thereover in the same chamber in order to prevent oxidation of the microcrystalline semiconductor film. Film formation conditions at this time are, for example, set as follows: a high-frequency power source with a frequency of 60 MHz is used, 30 W of power is applied, the gap between the electrodes is 25 mm, only a silane gas is used and the flow rate of a silane gas is 60 sccm, the pressure is 28 Pa, and the substrate temperature is 200° C.

Furthermore, before or after forming each of these microcrystalline semiconductor films, a high-frequency power with a frequency in the VHF band may be supplied to perform hydrogen plasma treatment.

Thickness variation of a film which is obtained with the plasma processing apparatus illustrated in FIG. 1, that is, a plasma processing apparatus in which at least one high-frequency power source with a frequency in the VHF band is used, can be within ±10%, which is the minimum required thickness uniformity for manufacturing a semiconductor device.

Figure 2:
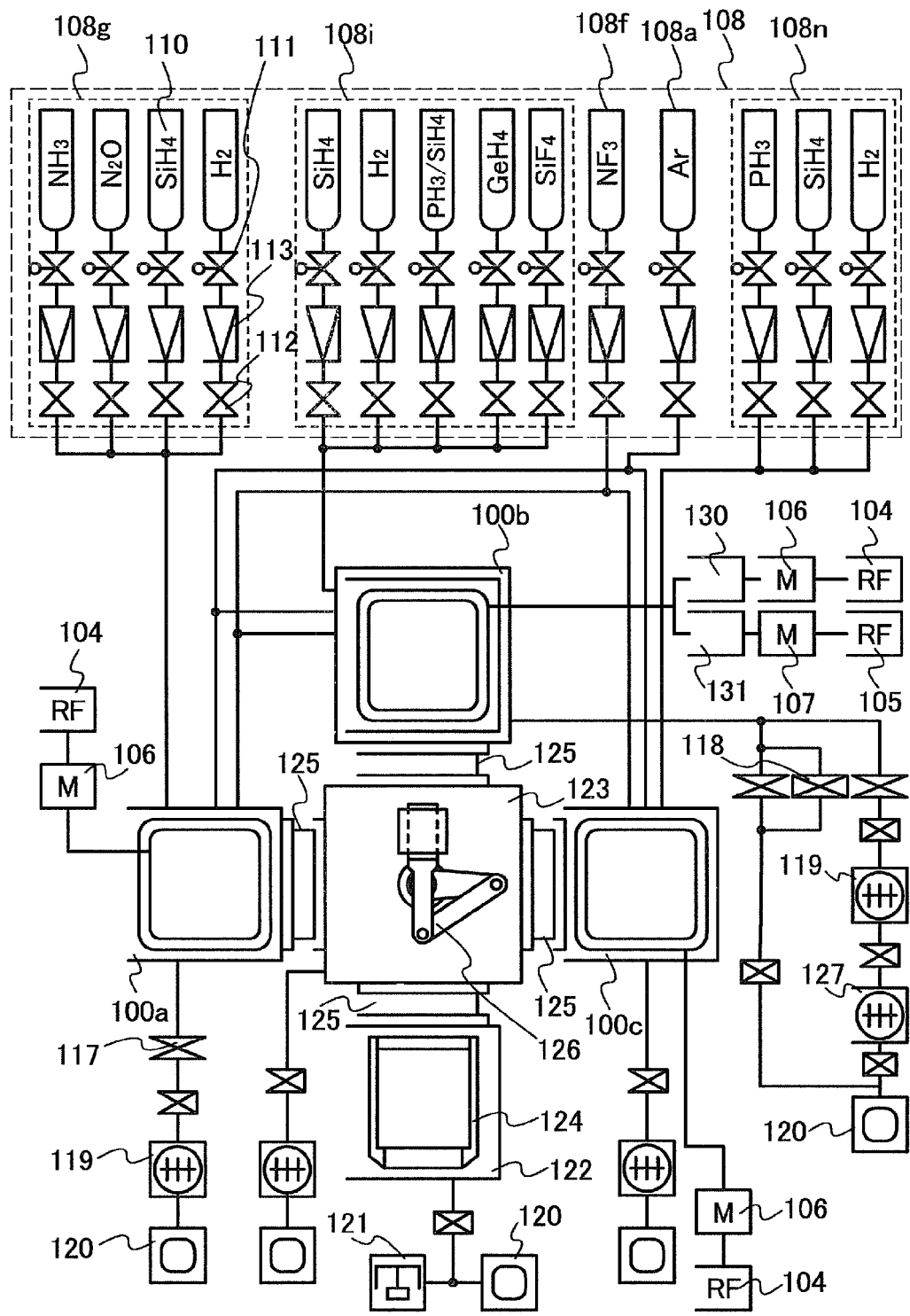
FIG. 2 illustrates a structure of a multi-chamber plasma processing apparatus provided with a plurality of treatment chambers.

FIG. 2 illustrates an example of a multi-chamber plasma processing apparatus provided with a plurality of reaction chambers. As one of the plurality of reaction chambers, the plasma processing apparatus illustrated in FIG. 1 is used. This apparatus is provided with a common chamber 123, a load/unload chamber 122, a first reaction chamber 100a, a second reaction chamber which is a reaction chamber 100b corresponding to the reaction chamber illustrated in FIG. 1, and a third reaction chamber 100c. This multi-chamber plasma processing apparatus is a single-wafer processing type in which a substrate set in a cassette 124 in the load/unload chamber 122 is carried in and out of each reaction chamber by a transport unit (means) 126 of the common chamber 123. A gate valve 125 is provided between the common chamber 123 and each reaction chamber, so that treatments conducted in the reaction chambers do not interfere with each other.

The reaction chambers are separately used for forming different kinds of thin films. For example, an insulating film such as a gate insulating film is formed in the first reaction chamber 100a, a microcrystalline semiconductor layer or an amorphous semiconductor layer is formed in the reaction chamber 100b, and a semiconductor layer to which an impurity imparting one conductivity type is added and which forms a source and a drain (typically, an n⁺-type semiconductor layer) is formed in the third reaction chamber 100c. Needless to say, the number of the reaction chambers is not limited to three and may be increased or decreased as needed. Further, one film may be formed in one reaction chamber, or a plurality of films may be formed in one reaction chamber.

A turbo molecular pump 119 and a dry pump 120 are connected to each reaction chamber as an evacuation unit (means). The evacuation unit is not limited to a combination of these vacuum pumps, and another vacuum pump can be used as long as evacuation can be performed to a degree of vacuum with the range of approximately $10^{-1}$ Pa to $10^{-5}$ Pa.

A cryopump 121 is connected to the load/unload chamber 122, and either of the cryopump 121 and the dry pump 120 can be used by switching between the cryopump 121 and the dry pump 120.

A gas supply unit (means) 108 includes a cylinder 110 filled with a gas used for the process, such as a rare gas or a semiconductor source gas typified by silane, a stop valve 112, a mass flow controller 113, and the like. A gas supply unit (means) 108g is connected to the first reaction chamber 100a to supply a gas for forming a gate insulating film. A gas supply unit (means) 108i is connected to the reaction chamber 100b to supply a gas for forming a microcrystalline semiconductor film (or an amorphous semiconductor film). A gas supply unit (means) 108n is connected to the third reaction chamber 100c to supply a gas for forming, for example, an n⁺-type semiconductor film. A gas supply unit (means) 108a supplies argon, and a gas supply unit (means) 108f supplies an etching gas used for cleaning of the inside of the reaction chambers.

Thus, the gas supply units 108a and 108f are provided in common for each reaction chamber.

A high-frequency power supply unit (means) is connected to each reaction chamber for generating glow discharge plasma. The high-frequency power supply unit (means) includes a high-frequency power source, a matching box, and a high-frequency cut filter.

As described in this embodiment, the plurality of reaction chambers are used and connected with the common chamber, whereby a plurality of different layers can be stacked successively without being exposed to the atmosphere.

Specifically, a flat plate-like substrate having an insulating surface such as a glass substrate, which is provided with a gate electrode or a capacitor electrode in advance, is set in the load/unload chamber 122, and a gate insulating film is formed in the first reaction chamber 100a. For example, film formation conditions of the gate insulating film are set as follows: a high-frequency power source with a frequency of 60 MHz is used, 160 W of power is applied, the gap between the electrodes is 25 mm, the flow rate of a silane gas is 5 sccm, the flow rate of an $NH_3$ gas is 400 sccm, the flow rate of an argon gas is 50 sccm, the pressure is 80 Pa, and the substrate temperature is 250° C. Then, the substrate is carried into the reaction chamber 10b, and a microcrystalline semiconductor film and an amorphous semiconductor film are stacked in the reaction chamber 100b. The microcrystalline semiconductor film is formed by utilizing a mixed gas of a silicon hydride gas such as silane and hydrogen and/or a rare gas and glow discharge plasma that is produced by applying high-frequency powers in the HF band (3 MHz to 30 MHz, typically, 13.56 MHz) and in the VHF band which are superposed on each other. A typical silicon hydride gas is $SiH_4$ or $Si_2H_6$. In addition, $SiH_2Cl_2$, $SiHCl_3$, $SiC_4$, $SiF_4$, or the like can be used as a silicon halide gas or a silicon halide hydride gas. Silane or the like is diluted with hydrogen and/or a rare gas to be 10 to 2000 times thinner. Therefore, a large amount of hydrogen and/or a rare gas is needed. The substrate is heated to 100° C. to 300° C., preferably 120° C. to 220° C. It is preferable that the film be formed at temperatures of 120° C. to 220° C. in order that a growing surface of the microcrystalline silicon film is inactivated with hydrogen, and growth of microcrystalline silicon is promoted. The amorphous semiconductor film stacked over the microcrystalline semiconductor film serves as a buffer layer and protects the microcrystalline semiconductor film. The microcrystalline semiconductor film and the amorphous semiconductor film can be formed under the above-described film formation conditions. Next, the substrate is carried into the third reaction chamber 100c, and an $n^+$-type semiconductor film is formed in the third reaction chamber 100c. For example, film formation conditions for forming the $n^+$-type semiconductor film are set as follows: a high-frequency power source with a frequency of 27.12 MHz is used, 30 W of power is applied, the gap between the electrodes is 25 mm, the flow rate of a silane gas is 60 sccm, the flow rate of a phosphine gas which is diluted with hydrogen to 0.5% is 110 sccm, the pressure is 30 Pa, and the substrate temperature is 200° C. After forming the $n^+$-type semiconductor film, the substrate is carried into the load/unload chamber 122 and carried out of the load/unload chamber 122 to the outside of the apparatus. Then, subsequent steps are performed, whereby a thin film transistor can be manufactured.

Embodiment 2

In this embodiment, a manufacturing process of a thin film transistor used for a liquid crystal display device will be described with reference to FIGS. 3A and 3B, FIGS. 4A to 4D, FIGS. 5A to 5C, and FIG. 6. FIGS. 3A and 3B, FIGS. 4A to 4D, and FIGS. 5A to 5C are cross-sectional views illustrating a manufacturing process of a thin film transistor, and FIG. 6 is a top view illustrating a connection region of a thin film transistor and a pixel electrode in one pixel.

Figure 3A:
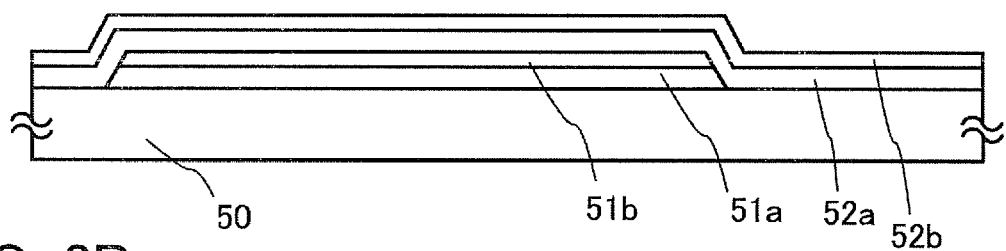
FIGS. 3A and 3B are cross-sectional views illustrating a manufacturing process of a thin film transistor.

As illustrated in FIG. 3A, a gate electrode obtained by stacking metal layers is formed over a substrate 50.

As the substrate 50, a plastic substrate having heat resistance that can withstand a process temperature of this manufacturing process or the like can be used, in addition to a non-alkaline glass substrate manufactured by a fusion method or a float method such as a substrate of a barium borosilicate glass, an aluminoborosilicate glass, or an aluminosilicate glass, and a ceramic substrate. In addition, a metal substrate such as a stainless steel alloy substrate, provided with an insulating film over its surface, may also be used. When the substrate 50 is mother glass, the substrate may have any of the following sizes: the first generation (300 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode is formed using a metal material such as titanium, molybdenum, chromium, tantalum, tungsten, or aluminum or an alloy material thereof. The gate electrode can be formed in such a manner that a conductive film is formed over the substrate 50 by a sputtering method, a mask is formed over the conductive film by a photolithography technique or an ink-jet method, and the conductive film is etched using the mask. Alternatively, the gate electrode can be formed by depositing a conductive nanopaste of silver, gold, copper, or the like using an ink-jet method, and then baking the nanopaste. Note that as a barrier metal which increases adhesion between the gate electrode and the substrate 50 and prevents diffusion to a base, a nitride film of any of the above-described metal materials may be provided between the substrate 50 and the gate electrode. Here, stacked films formed over the substrate 50 are etched by using a resist mask that is formed using a first photomask, whereby the gate electrode is formed.

As a specific example of the structure of the gate electrode, a molybdenum film that becomes a second conductive layer 51b may be stacked over an aluminum film that becomes a first conductive layer 51a, to have a structure that prevents hillock and electromigration that are typical phenomena of aluminum. Since this embodiment describes an example of manufacturing a display device with a large display screen by use of a large-area substrate, the gate electrode is formed by stacking the first conductive layer 51a made of aluminum, which has low electric resistance, and the second conductive layer 51b, which has higher heat resistance than the first conductive layer 51a. Alternatively, a three-layer structure in which an aluminum film is sandwiched by molybdenum films may be employed as well. Further, as other examples of the structure of the gate electrode, a layered structure in which a molybdenum film is stacked over a copper film, a layered structure in which a titanium nitride film is stacked over a copper film, and a layered structure in which a tantalum nitride film is stacked over a copper film can be given.

Note that, because a semiconductor film and a wiring are formed over the gate electrode, it is desired that the gate electrode be processed so as to have tapered end portions in order to prevent disconnection. Further, although not illustrated, a wiring connected to the gate electrode can also be formed at the same time when the gate electrode is formed.

Next, gate insulating films 52a and 52b are formed over the second conductive layer 51b, which is an upper layer of the gate electrode.

As each of the gate insulating films, a silicon nitride film, a silicon oxynitride film, or a silicon nitride oxide film is formed in the first reaction chamber 100a described in Embodiment 1. In this embodiment, a silicon nitride film is formed as the gate insulating film 52a that is a first layer and, without being exposed to the atmosphere, a silicon oxynitride film is stacked thereover as the gate insulating film 52b that is a second layer. FIG. 3A is a cross-sectional view after the steps described above.

Note that a silicon oxynitride film means a film that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms included in the silicon oxynitride film or the silicon nitride oxide film is defined as 100 at. %.

Then, after the gate insulating films are formed, the substrate is transferred without being exposed to the atmosphere, and a microcrystalline semiconductor film is formed in a vacuum chamber which is different from the vacuum chamber for forming the gate insulating films. In this embodiment, a microcrystalline semiconductor film is formed in the reaction chamber 100b described in Embodiment 1.

Before the substrate is carried into the reaction chamber 100b, preferably, hydrogen or a rare gas is introduced to generate plasma so that a gas (an atmospheric component such as oxygen or nitrogen, or an etching gas used for cleaning the reaction chamber) attached to the inner wall of the reaction chamber 100b is removed.

Then, the substrate is carried into the reaction chamber 100b, and a microcrystalline silicon film 53 is formed over the gate insulating films. The microcrystalline silicon film 53 can be typically formed by generating plasma by diluting silicon hydride such as $SiH_4$ or $Si_2H_6$ with hydrogen. The microcrystalline silicon film 53 can be formed using hydrogen with a flow rate greater than or equal to 12 times and less than or equal to 1000 times, preferably greater than or equal to 50 times and less than or equal to 200 times, more preferably 100 times that of silicon hydride. Note that, in place of silicon hydride, $SiH_2Cl_2$, $SiHCl_3$, $SiCl_4$, $SiF_4$, or the like can be used.

Next, an i-type amorphous silicon film 54 is formed in the same reaction chamber without being exposed to the atmosphere. The i-type amorphous silicon film 54 can be formed by using only silicon hydride or using silicon hydride and hydrogen with a flow rate greater than or equal to 1 time and less than or equal to 10 times, preferably greater than or equal to 1 time and less than or equal to 5 times that of silicon hydride and, in this case, an i-type amorphous silicon film including hydrogen can be formed.

Figure 3B:
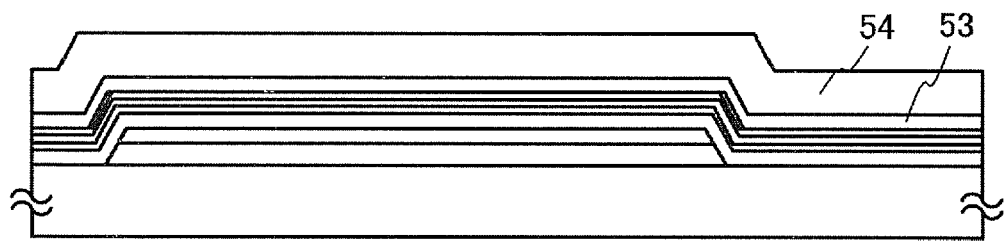

Therefore, as illustrated in FIG. 3B, a layered structure of the microcrystalline silicon film 53 and the i-type amorphous silicon film 54 is formed.

In addition, through the above-described procedure and by the use of the reaction chamber 100b, the concentration of not only oxygen but also nitrogen and carbon, which are mixed around the interface between the layered structure and the gate insulating films, can be reduced.

Then, after the i-type amorphous silicon film 54 is formed, the substrate is transferred without being exposed to the atmosphere, and a semiconductor film 55 to which an impurity imparting one conductivity type is added is preferably formed in a vacuum chamber which is different from the vacuum chamber for forming the i-type amorphous silicon film.

As a typical example of the impurity imparting one conductivity type added to the semiconductor film 55, phosphorus is given. In this case, a phosphine gas or the like which is a gas including an impurity imparting one conductivity type may be added to silicon hydride. The semiconductor film 55 to which the impurity imparting one conductivity type is added is formed to a thickness of greater than or equal to 2 nm and less than or equal to 50 nm. With the thickness of the semiconductor film (also referred to as an $n^+$-type semiconductor film) to which the impurity imparting one conductivity type is added being thin, the throughput can be improved.

Figure 4A:
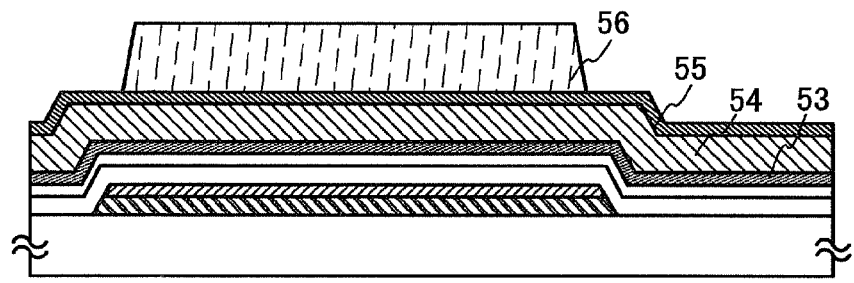
FIGS. 4A to 4D are cross-sectional views illustrating a manufacturing process of a thin film transistor.

Next, as illustrated in FIG. 4A, a resist mask 56 is formed over the semiconductor film 55 to which the impurity imparting one conductivity type is added. The resist mask 56 is formed by a photolithography technique or an ink-jet method. In this embodiment, using a second photomask, a resist that is applied to the semiconductor film 55 to which the impurity imparting one conductivity type is added is exposed to light and developed, whereby the resist mask 56 is formed.

Figure 4B:
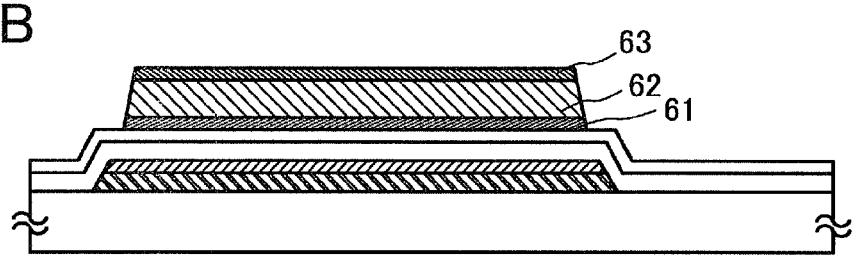

Then, by using the resist mask 56, the microcrystalline silicon film 53, the i-type amorphous silicon film 54, and the semiconductor film 55 to which the impurity imparting one conductivity type is added are etched, so that a microcrystalline silicon film 61, an i-type amorphous silicon film 62, and a semiconductor film 63 to which the impurity imparting one conductivity type is added are formed, as illustrated in FIG. 4B. After that, the resist mask 56 is removed.

Since side surfaces of end portions of the microcrystalline silicon film 61 and the i-type amorphous silicon film 62 are inclined, generation of a leakage current between the microcrystalline silicon film 61 and a source and drain regions formed over the i-type amorphous silicon film 62 can be prevented. Further, generation of a leakage current between the microcrystalline silicon film 61 and a source and drain electrodes can be prevented. Each of inclination angles of the side surfaces of the end portions of the microcrystalline silicon film 61 and the i-type amorphous silicon film 62 is 30° to 90°, preferably 45° to 80°. By adopting such an angle, disconnection of the source electrode or the drain electrode due to a step can be prevented.

Figure 4C:
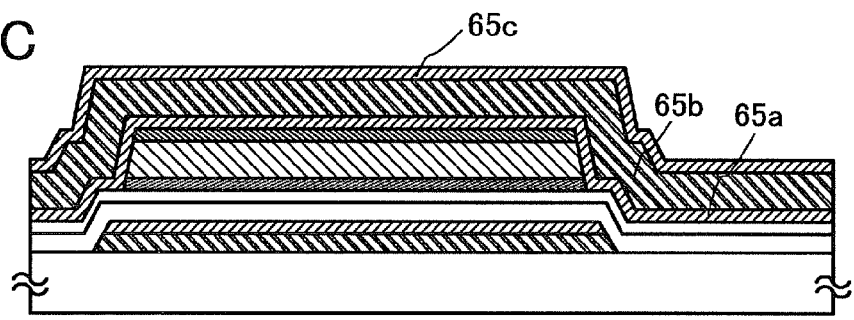

Next, as illustrated in FIG. 4C, conductive films 65a to 65c are formed so as to cover the semiconductor film 63 to which the impurity imparting one conductivity type is added and the gate insulating film 52b. The conductive films 65a to 65c are preferably formed with a single layer or a stacked layer using aluminum, copper, or an aluminum alloy to which an element to improve heat resistance or an element to prevent a hillock, such as silicon, titanium, neodymium, scandium, or molybdenum, is added. Alternatively, a film in contact with the semiconductor film to which the impurity imparting one conductivity type is added may be formed of titanium, tantalum, molybdenum, or tungsten, or a nitride of such an element, and aluminum or an aluminum alloy may be formed thereover to form a layered structure. Further alternatively, top and bottom surfaces of aluminum or an aluminum alloy may be each covered with titanium, tantalum, molybdenum, or tungsten, or a nitride of such an element to form a layered structure. Here, as the conductive film, a layered conductive film in which molybdenum films are used for the conductive films 65a and 65c and an aluminum film is used for the conductive film 65b is adopted. The conductive films 65a to 65c are formed by a sputtering method or a vacuum evaporation method.

Figure 4D:
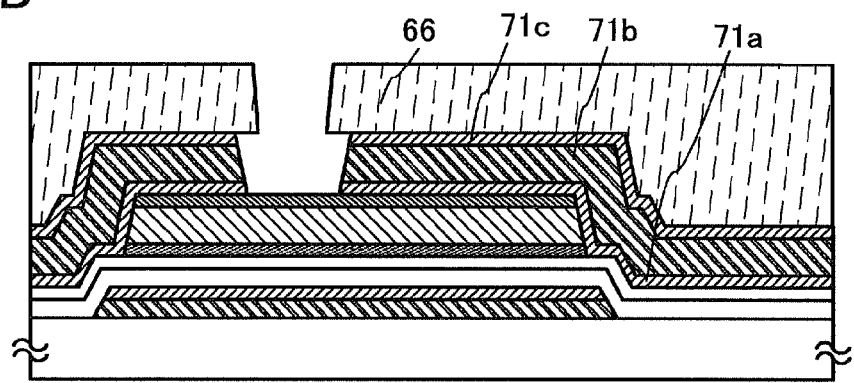

Next, as illustrated in FIG. 4D, a resist mask 66 is formed over the conductive films 65a to 65c using a third photomask, and the conductive films 65a to 65c are partly etched to form pairs of source and drain electrodes 71a to 71c. By performing wet etching on the conductive films 65a to 65c, the conductive films 65a to 65c are selectively etched. Since the conductive films 65a to 65c are isotropically etched, the source and drain electrodes 71a to 71c which have a smaller area than the resist mask 66 can be formed.

Figure 5A:
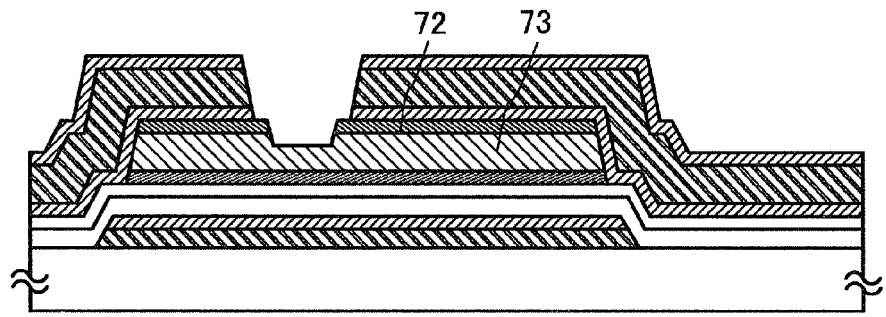
FIGS. 5A to 5C are cross-sectional views illustrating a manufacturing process of a thin film transistor.
Figure 6:
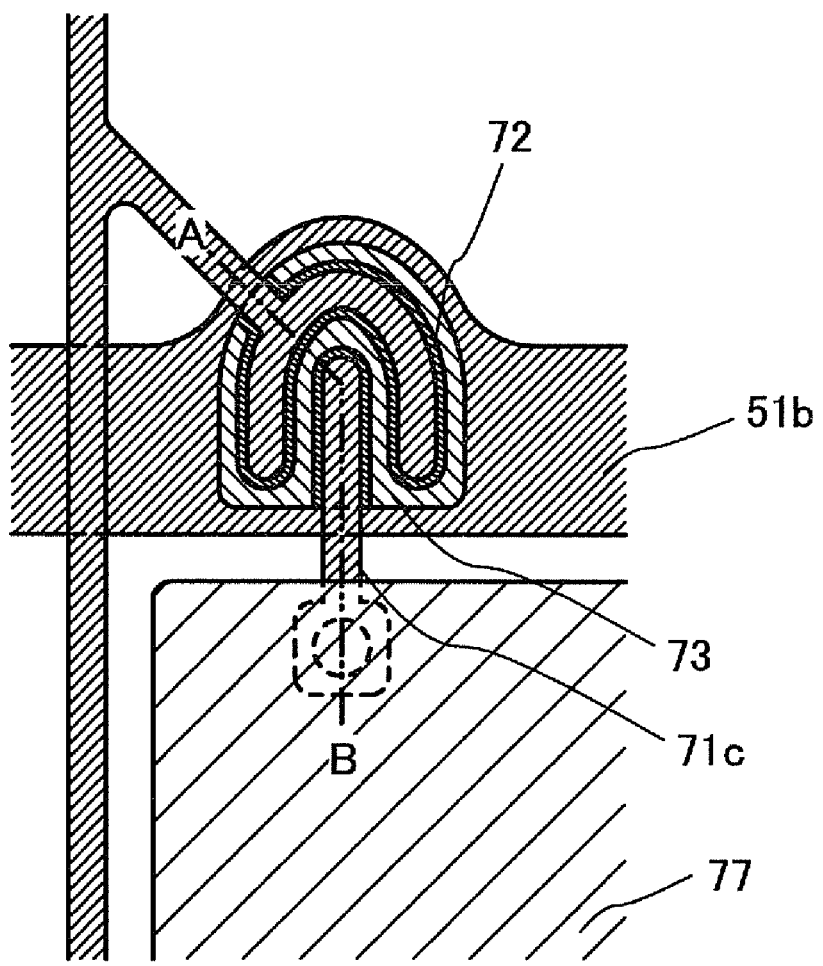
FIG. 6 is a top view illustrating a manufacturing process of a thin film transistor.

Next, as illustrated in FIG. 5A, the semiconductor film 63 to which the impurity imparting one conductivity type is added is etched using the resist mask 66, to form a pair of source and drain regions 72. Further, in the etching step, the i-type amorphous silicon film 62 is also partly etched. The i-type amorphous silicon film which is partly etched and provided with a hollow (a groove) is referred to as an i-type amorphous silicon film 73. The source and drain regions and the hollow (the groove) of the i-type amorphous silicon film can be formed in the same step. By forming the hollow (the groove) in the i-type amorphous silicon film with a depth of half to one-third the thickness of a region having the largest thickness of the i-type amorphous silicon film, the source region and the drain region can have a distance therebetween and a leakage current between the source region and the drain region can be reduced. After that, the resist mask 66 is removed.

Since the resist mask is changed in quality particularly when it is exposed to plasma used for dry etching or the like, the resist mask is not completely removed in the resist removal step, and a residue thereof remains. In order to prevent this, the i-type amorphous silicon film is etched by approximately 50 nm. The resist mask 66 is used twice, for the etching treatment of part of the conductive films 65a to 65c and the etching treatment at the time of forming the source and drain regions 72. In the case where dry etching is used for both the etching treatments, a residue tends to remain. Thus, it is effective to form the i-type amorphous silicon film which may be etched when the residue is completely removed, with a large thickness.

Figure 5B:
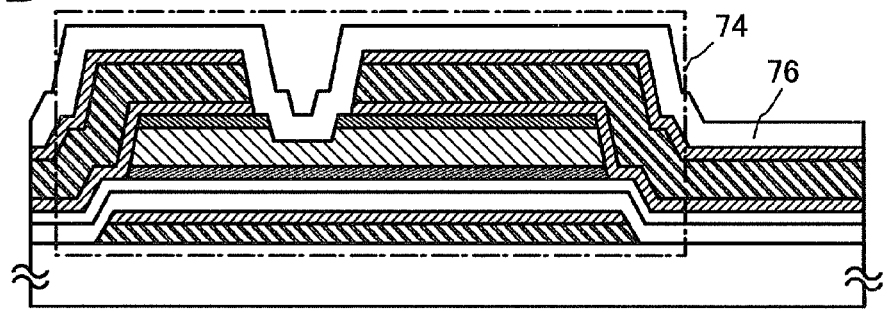
Figure 5C:
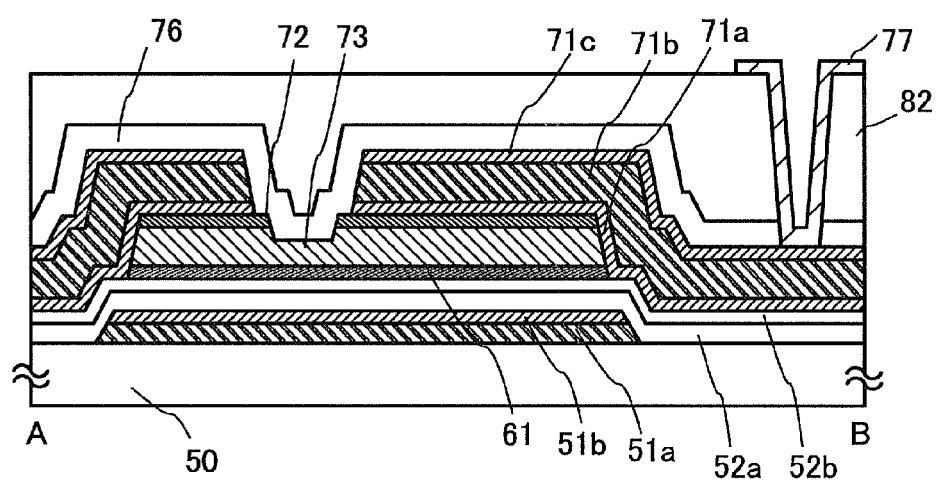

Next, as illustrated in FIG. 5B, an insulating film 76 is formed so as to cover the source and drain electrodes 71a to 71c, the source and drain regions 72, the i-type amorphous silicon film 73, the microcrystalline silicon film 61, and the gate insulating film 52b. The insulating film 76 can be formed by using the same method as the method for forming the gate insulating films 52a and 52b. Note that the insulating film 76 is provided to prevent a contaminant impurity such as an organic substance, a metal, or moisture included in the atmosphere from entering and is preferably a dense film. In addition, by using a silicon nitride film as the insulating film 76, the oxygen concentration in the i-type amorphous silicon film 73 can be less than or equal to $5\times10^{19}$ atoms/cm$^3$, preferably less than or equal to $1\times10^{19}$ atoms/cm$^3$.

When the end portions of the source and drain electrodes 71a to 71c and the end portions of the source and drain regions 72 are not aligned with each other as illustrated in FIG. 5B, a distance between the end portions of the source and drain electrodes 71a to 71c is long. Therefore, generation of a leakage current and short circuit between the source electrode and the drain electrode can be prevented. Further, since the end portions of the source and drain electrodes 71a to 71c and the end portions of the source and drain regions 72 are not aligned with each other, a leakage current between the gate electrode and the source and drain electrodes 71a to 71c can be prevented because an electric field does not concentrate at the end portions of the source and drain electrodes 71a to 71c and the source and drain regions 72. Accordingly, a thin film transistor with high reliability and high withstand voltage can be manufactured.

By the above process, a thin film transistor 74 can be formed.

As for the thin film transistor described in this embodiment, the gate insulating films, the microcrystalline silicon film, the i-type amorphous silicon film, the source and drain regions, and the source and drain electrodes are stacked over the gate electrode. In addition, the hollow (the groove) is formed in part of the i-type amorphous silicon film, and a region other than the hollow is covered with the source and drain regions. That is, due to the hollow formed in the i-type amorphous silicon film, a distance between the source region and the drain region is long. Thus, a leakage current between the source region and the drain region can be reduced. Moreover, since the hollow is formed by partly etching the i-type amorphous silicon film, an etching residue which is generated in the formation step of the source and drain regions can be removed. Accordingly, generation of a leakage current (a parasitic channel) between the source region and the drain region due to the etching residue can be prevented.

Next, a planarization film 82 is formed over the insulating film 76. The planarization film 82 is formed using an organic resin film. Then, a contact hole is formed by partly etching the insulating film 76 and the planarization film 82 with the use of a resist mask formed using a fourth photomask. Then, a pixel electrode 77 which is in contact with the source or drain electrode 71c through the contact hole is formed. Note that FIG. 5C corresponds to a cross-sectional view taken along dashed line A-B in FIG. 6.

As illustrated in FIG. 6, the end portions of the source and drain regions 72 are positioned on the outer side than the end portions of the source and drain electrodes 71c. In addition, the end portion of the i-type amorphous silicon film 73 is located on the outer side than the end portions of the source and drain electrode 71c and the end portions of the source and drain regions 72. Furthermore, one of the source and drain electrodes partly surrounds the other of the source and drain electrodes (specifically, the former electrode is in a U-shape or a C-shape). Thus, an area of a region where carriers travel can be increased and, thus, the amount of a current can be increased and further, an area for a thin film transistor can be reduced. Note that one of the source and drain electrodes also functions as a source or drain wiring.

Further, for the pixel electrode 77, a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Alternatively, the pixel electrode 77 can be formed using a conductive composition including a conductive high molecule (also referred to as a conductive polymer). The pixel electrode formed of the conductive composition preferably has a sheet resistance less than or equal to 10000 Ω/square and a light transmittance greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. As examples thereof, polyaniline or a derivative thereof, polypyrrole or a derivative thereof, polythiophene or a derivative thereof, a copolymer of two or more kinds of them, and the like can be given.

Here, as the pixel electrode 77, a film of indium tin oxide is formed by a sputtering method, and then a resist is applied to the indium tin oxide film. Next, the resist is exposed to light and developed using a fifth photomask, thereby forming a resist mask. After that, the indium tin oxide film is etched using the resist mask, whereby the pixel electrode 77 is formed.

By the above process, an element substrate which can be used for a display device can be formed.

Embodiment 3

In this embodiment, a manufacturing process of a thin film transistor which has a different structure from that of Embodiment 2 and in which high-speed operation can be performed, an on-state current is large, and an off-state current is small will be described.

An n-channel thin film transistor having an amorphous semiconductor layer or a microcrystalline semiconductor layer is more suitable for use in a driver circuit than a p-channel one because it has higher field-effect mobility. It is preferable that all thin film transistors formed over the same substrate have the same polarity, in order to reduce the number of manufacturing steps. In this embodiment, description is made using an n-channel thin film transistor.

A manufacturing process of a thin film transistor will be described with reference to FIGS. 7A to 7E, FIGS. 8A to 8C, FIGS. 9A to 9D, and FIG. 10. Note that the left sides of FIGS. 7A to 7E and FIGS. 8A to 8C are each a cross-sectional view taken along line A-B of FIG. 10, which illustrates a cross section of a region where the thin film transistor is formed; and the right sides thereof are each a cross-sectional view taken along line C-D of FIG. 10, which illustrates a cross section of a region where a gate wiring and a source wiring intersect in a pixel.

Figure 7A:
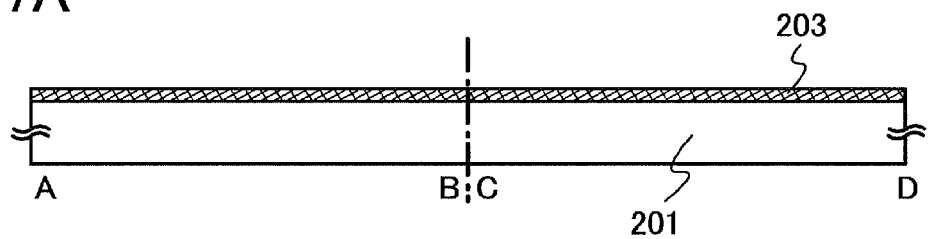
FIGS. 7A to 7E are cross-sectional views illustrating a manufacturing process of a thin film transistor.

As illustrated in FIG. 7A, a conductive layer 203 is formed over a substrate 201. The conductive layer 203 can be formed using any of the conductive materials which can be used for the gate electrode described in Embodiment 1. The conductive layer 203 is formed by a sputtering method, a CVD method, a plating method, a printing method, a droplet discharge method, or the like.

Figure 7B:
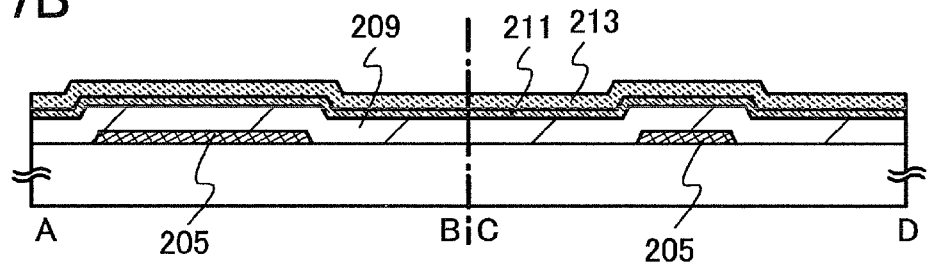

Next, after a resist is applied to the conductive layer 203, a resist mask is formed by a photolithography process using a first photomask. With this resist mask, the conductive layer 203 is etched into a desired shape, so that a gate wiring 205 is formed as illustrated in FIG. 7B. After that, the resist mask is removed.

Then, a gate insulating film 209 is formed over the gate wiring 205 and the substrate 201. The gate insulating film 209 can be formed using any of the materials which can be used for the gate insulating film described in Embodiment 1. The gate insulating film 209 is formed by a CVD method, a sputtering method, or the like. In this embodiment, a silicon nitride film with a thickness of 240 nm is formed in the first reaction chamber 100a described in Embodiment 1.

Next, a conductive layer 211 and a buffer layer 213 are stacked over the gate insulating film 209. A film formation method in the case where the conductive layer 211 is a semiconductor layer to which an impurity element serving as a donor is added is described below.

In a reaction chamber of a plasma processing apparatus, hydrogen and a deposition gas including silicon or germanium are mixed, and a microcrystalline semiconductor layer or an amorphous semiconductor layer is formed by glow discharge plasma. A microcrystalline semiconductor layer is formed by dilution with hydrogen whose flow rate is 10 to 2000 times, preferably 50 to 200 times that of the deposition gas including silicon or germanium. The substrate is heated to 100° C. to 300° C., preferably 120° C. to 220° C. Then, a gas including phosphorus, arsenic, antimony, or the like is mixed to the above-described source gas, so that a semiconductor layer to which an impurity element serving as a donor is added can be formed. In this embodiment, a microcrystalline silicon layer including phosphorus can be formed by glow discharge plasma, with phosphine mixed with silane and hydrogen and/or a rare gas. Typical examples of the deposition gas including silicon or germanium include $SiH_4$, $Si_2H_6$, $Ge_2H_4$, $Ge_2H_6$, and the like.

In the step of forming the semiconductor layer to which the impurity element serving as a donor is added, glow discharge plasma is generated by applying a high-frequency power with a frequency of 3 MHz to 30 MHz, typically 13.56 MHz or 27.12 MHz, or a high-frequency power with a frequency of 30 MHz to about 300 MHz, typically 60 MHz. In this embodiment, the conductive layer 211 and the buffer layer 213 are stacked in the reaction chamber 100b described in Embodiment 1 without being exposed to the atmosphere. As the conductive layer 211, an n⁻-type microcrystalline silicon film with a thickness of 20 nm is formed under the following conditions: a high-frequency power source with a frequency of 60 MHz is used, 15 W of power is applied, the gap between the electrodes is 20 mm, the flow rate of a silane gas including phosphine at 100 ppm is 2 sccm, the flow rate of a hydrogen gas is 400 sccm, the pressure is 100 Pa, and the substrate temperature is 200° C. The Raman intensity ratio (Ic/Ia) of the n⁻-type microcrystalline silicon film which is obtained under the above film formation conditions is about 4 to 5.

Instead of forming the semiconductor layer to which the impurity element serving as a donor is added, an insulating layer to which the impurity element serving as a donor is added may be formed as the gate insulating film 209, and a semiconductor layer which does not include the impurity element serving as a donor may be formed thereover. For example, a silicon oxide layer, a silicon nitride layer, a silicon oxynitride layer, a silicon nitride oxide layer, or the like including the impurity element serving as a donor (phosphorus, arsenic, or antimony) can be formed as the gate insulating film. Alternatively, when the gate insulating film 209 has a layered structure, the impurity element serving as a donor may be added to a layer in contact with the microcrystalline semiconductor layer or a layer in contact with the substrate 201.

As a method for forming the insulating layer to which the impurity element serving as a donor is added as the gate insulating film 209, the insulating layer may be formed using a gas including the impurity element serving as a donor, in addition to a source gas of the insulating layer. For example, a silicon nitride layer including phosphorus can be formed by a plasma CVD method using silane, ammonia, and phosphine. In addition, by a plasma CVD method using silane, dinitrogen monoxide, ammonia, and phosphine, a silicon oxynitride layer including phosphorus can be formed.

Alternatively, before the gate insulating film 209 is formed, a gas including the impurity element serving as a donor may be supplied into a reaction chamber of a film formation apparatus such that the impurity element serving as a donor is adsorbed onto the surface of the substrate 201 and the inner wall of the reaction chamber. After that, by forming the gate insulating film 209, the insulating layer is deposited while taking in the impurity element serving as a donor, so that the insulating layer to which the impurity element serving as a donor is added can be formed as the gate insulating film 209.

Further alternatively, before the semiconductor layer to which the impurity element serving as a donor is added is formed, the gas including the impurity element serving as a donor may be supplied into the reaction chamber of the film formation apparatus such that the impurity element serving as a donor is adsorbed onto the gate insulating film 209 and the inner wall of the reaction chamber. After that, by depositing a semiconductor layer, a microcrystalline semiconductor layer is deposited while taking in the impurity element serving as a donor, so that the semiconductor layer to which the impurity element serving as a donor is added can be formed as the conductive layer 211.

In the case where the conductive layer 211 is a metal layer, a metal nitride layer, a metal carbide layer, a metal boride layer, or a metal silicide layer, the conductive layer is formed by a sputtering method, an evaporation method, a CVD method, a droplet discharge method, a printing method, or the like.

Note that when the gate insulating film 209 is a silicon oxide layer or a silicon oxynitride layer, the surface of the gate insulating film 209 may be subjected to plasma treatment before the conductive layer 211 is formed. Typically, the surface of the gate insulating film 209 is exposed to plasma such as hydrogen plasma, ammonia plasma, $H_2O$ plasma, helium plasma, argon plasma, or neon plasma. Consequently, defects at the surface of the gate insulating film can be reduced. Typically, dangling bonds at the surface of the gate insulating film 209 can be terminated. After that, a conductive layer or an amorphous semiconductor layer is formed, so that defects at the interface with the conductive layer or the amorphous semiconductor can be reduced. As a result, the number of carriers captured due to the defects can be reduced, which leads to increase in on-state current.

Next, the buffer layer 213 is formed. In the case where a semiconductor layer is formed as the buffer layer 213, an amorphous semiconductor layer can be formed by a plasma CVD method using a deposition gas including silicon or germanium. For example, an amorphous semiconductor layer can be formed by using only a silane gas. Alternatively, by dilution of a deposition gas including silicon or germanium with one or plural kinds of rare gases selected from helium, argon, krypton, or neon, an amorphous semiconductor layer can be formed. Further alternatively, with the use of also hydrogen at a flow rate which is greater than or equal to 1 time and less than or equal to 10 times, preferably greater than or equal to 1 time and less than or equal to 5 times that of a silane gas, an amorphous semiconductor layer including hydrogen can be formed. In addition, halogen such as fluorine or chlorine may be added to the above hydrogenated semiconductor layer.

In this embodiment, as the buffer layer 213, an i-type amorphous silicon film with a thickness of 50 nm is formed in the reaction chamber 100b described in Embodiment 1 under the following conditions: a high-frequency power source with a frequency of 60 MHz is used, 30 W of power is applied, the gap between the electrodes is 25 mm, the flow rate of a silane gas is 60 sccm, the pressure is 28 Pa, and the substrate temperature is 200° C.

In addition, in the case where the conductive layer 211 is the semiconductor layer to which the impurity element serving as a donor is added, it is preferable that the buffer layer 213 be formed at 300° C. to 400° C. by a plasma CVD method. By this film formation treatment, hydrogen is supplied to the semiconductor layer to which the impurity element serving as a donor is added, which brings the same effect as hydrogenation of the semiconductor layer to which the impurity element serving as a donor is added. In other words, hydrogen is diffused into the semiconductor layer to which the impurity element serving as a donor is added by depositing the buffer layer 213 over the semiconductor layer to which the impurity element serving as a donor is added, so that the dangling bonds can be terminated.

When the semiconductor layer to which the impurity element serving as a donor is added is formed with a microcrystalline semiconductor layer, surfaces of crystal grains included in the semiconductor layer to which the impurity element serving as a donor is added can be prevented from native oxidation, by forming an amorphous semiconductor layer, furthermore, an amorphous semiconductor layer including hydrogen, nitrogen, or halogen as the buffer layer 213 over the surface of the semiconductor layer to which the impurity element serving as a donor is added. In particular, in a region where an amorphous semiconductor is in contact with a microcrystal grain, a crack is likely to be caused due to local stress. If the crack is exposed to oxygen, the crystal grain is oxidized to form silicon oxide. However, the oxidization of microcrystal grains can be prevented by forming an amorphous semiconductor layer over the surface of the semiconductor layer to which the impurity element serving as a donor is added. In a display device, typically in a liquid crystal display device, including a thin film transistor to which a high voltage (e.g., about 15 V) is applied, when the buffer layer is formed thickly, withstand voltage becomes high. Thus, deterioration of the thin film transistor can be prevented even when a high voltage is applied to the thin film transistor.

In addition, as the buffer layer 213, an amorphous semiconductor layer can be formed by sputtering with hydrogen or a rare gas using a semiconductor such as silicon or germanium as a target.

In the case where an insulating layer is formed as the buffer layer 213, it can be formed in a manner similar to that of the gate insulating film 209. Alternatively, polyimide, an acrylic resin, an epoxy resin, or another material for an organic insulating layer is applied and baked to form the insulating layer.

Figure 7C:
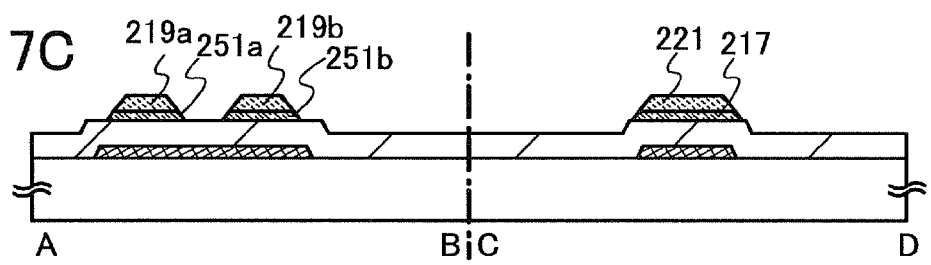

Next, a resist mask is formed by a photolithography process using a resist which is applied to the buffer layer 213 and a second photomask. The buffer layer 213 and the conductive layer 211 are etched into desired shapes with the use of the resist mask to form conductive layers 251a and 251b which are provided with a space therebetween and buffer layers 219a and 219b which are provided with a space therebetween in the region where the thin film transistor is to be formed, as illustrated in FIG. 7C. In addition, in the region where the gate wiring and the source wiring intersect, a conductive layer 217 and a buffer layer 221 are formed. After that, the resist mask is removed.

Figure 7D:
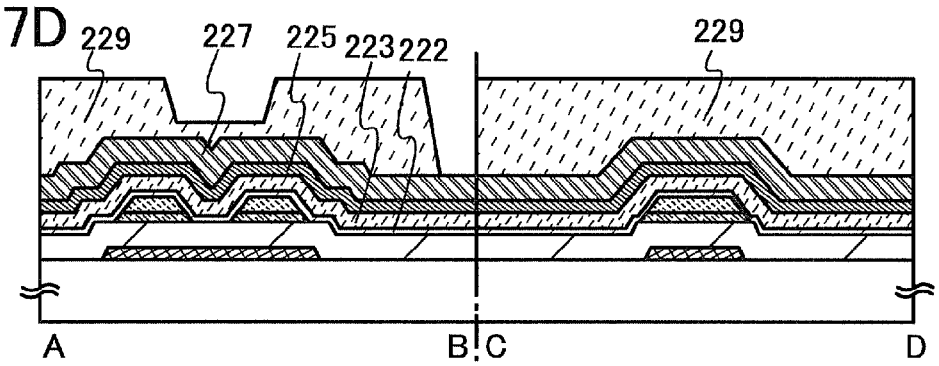

Next, as illustrated in FIG. 7D, a microcrystalline semiconductor layer 222 and an amorphous semiconductor layer 223 are stacked. In this embodiment, as the microcrystalline semiconductor layer 222, an i-type microcrystalline silicon film with a thickness of 10 nm is formed in the reaction chamber 100b described in Embodiment 1 under the following conditions: a high-frequency power source with a frequency of 60 MHz is used, 30 W of power is applied, the gap between the electrodes is 20 mm, the flow rate of a silane gas is 4 sccm, the flow rate of a hydrogen gas is 400 sccm, the pressure is 100 Pa, and the substrate temperature is 200° C.

In addition, the amorphous semiconductor layer 223 is formed over the microcrystalline semiconductor layer 222 without being exposed to the atmosphere. The amorphous semiconductor layer 223 can be formed in a manner similar to the case where the buffer layer 213 is formed using a semiconductor layer. In this embodiment, an amorphous silicon film with a thickness of 60 nm is formed in the reaction chamber 100b described in Embodiment 1 under the following conditions: a high-frequency power source with a frequency of 60 MHz is used, 30 W of power is applied, the gap between the electrodes is 25 mm, only a silane gas is used and the flow rate of a silane gas is 60 sccm, the pressure is 28 Pa, and the substrate temperature is 200° C.

The thickness of the i-type microcrystalline silicon film may be 20 nm, and in such a case, the thickness of the amorphous semiconductor layer 223 is set to be 70 nm.

Next, an impurity semiconductor layer 225 to which an impurity element imparting one conductivity type is added is formed over the amorphous semiconductor layer 223.

In this embodiment, an n-channel thin film transistor is formed and, thus, the impurity semiconductor layer 225 to which the impurity element imparting one conductivity type is added is formed by a plasma CVD method using phosphine and a deposition gas including silicon or germanium. In the case of forming a p-channel thin film transistor, it is formed by a plasma CVD method using diborane and a deposition gas including silicon or germanium.

As the impurity semiconductor layer 225 to which the impurity element imparting one conductivity type is added, an n+-type amorphous silicon film with a thickness of 50 nm is formed in the third reaction chamber 100c described in Embodiment 1. For example, the n+-type semiconductor film is formed under the following conditions: a high-frequency power source with a frequency of 27.12 MHz is used, 30 W of power is applied, the gap between the electrodes is 25 mm, the flow rate of a silane gas is 60 sccm, the flow rate of a phosphine gas which is diluted with hydrogen to 0.5% is 110 sccm, the pressure is 30 Pa, and the substrate temperature is 200° C.

In the steps of forming the conductive layer 211, the buffer layer 213, the microcrystalline semiconductor layer 222, the amorphous semiconductor layer 223, and the impurity semiconductor layer 225 to which the impurity element imparting one conductivity type is added, glow discharge plasma is generated by applying a high-frequency power with a frequency of 3 MHz to 30 MHz, typically 13.56 MHz or 27.12 MHz, or a high-frequency power with a frequency of 30 MHz to about 300 MHz, typically 60 MHz.

Next, a conductive layer 227 is formed over the impurity semiconductor layer 225 to which the impurity element imparting one conductivity type is added. The conductive layer 227 can be formed using any of the conductive materials which can be used for the conductive films 65a to 65c described in Embodiment 1. The conductive layer 227 is formed by a CVD method, a sputtering method, a printing method, a droplet discharge method, or the like.

Next, a resist is applied to the conductive layer 227. As the resist, a positive type resist or a negative type resist can be used. In this embodiment, a positive type resist is used.

Then, the resist is irradiated with light, using a multi-tone mask as a third photomask, and then developed to form a resist mask 229.

Now, light exposure using a multi-tone mask 159 is described with reference to FIGS. 9A to 9D.

A multi-tone mask can achieve three levels of light exposure to obtain an exposed portion, a half-exposed portion, and an unexposed portion, and one-time exposure and development step allows a resist mask with regions having plural thicknesses (typically, two kinds of thicknesses) to be formed. Thus, the number of photomasks can be reduced by using a multi-tone mask.

Figure 9A:
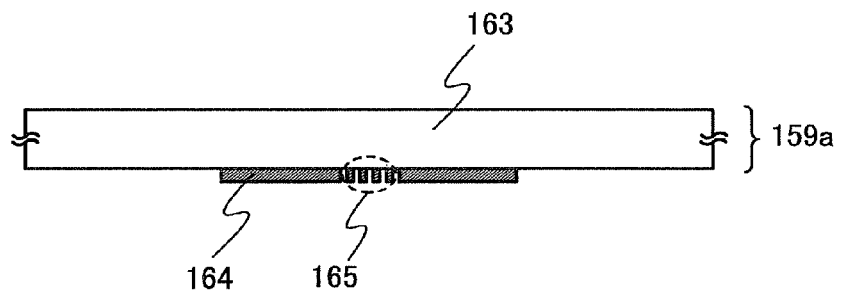
FIGS. 9A to 9D each illustrate a multi-tone mask.
Figure 9B:
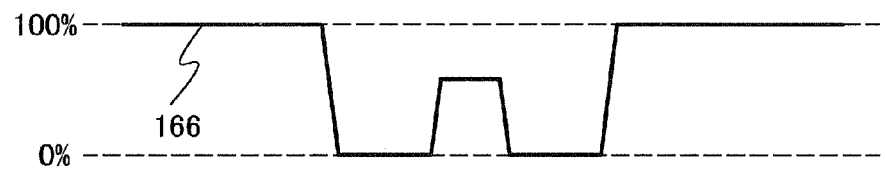
Figure 9C:
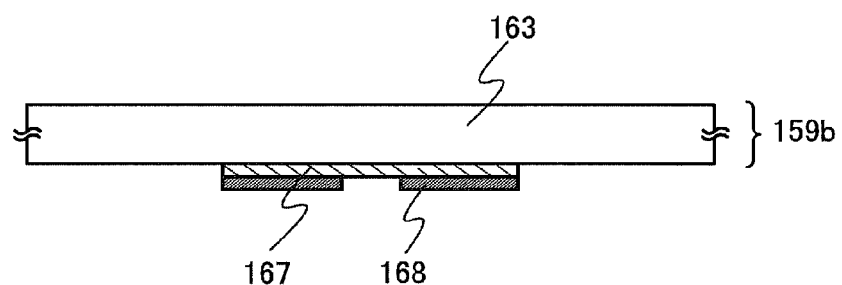
Figure 10:
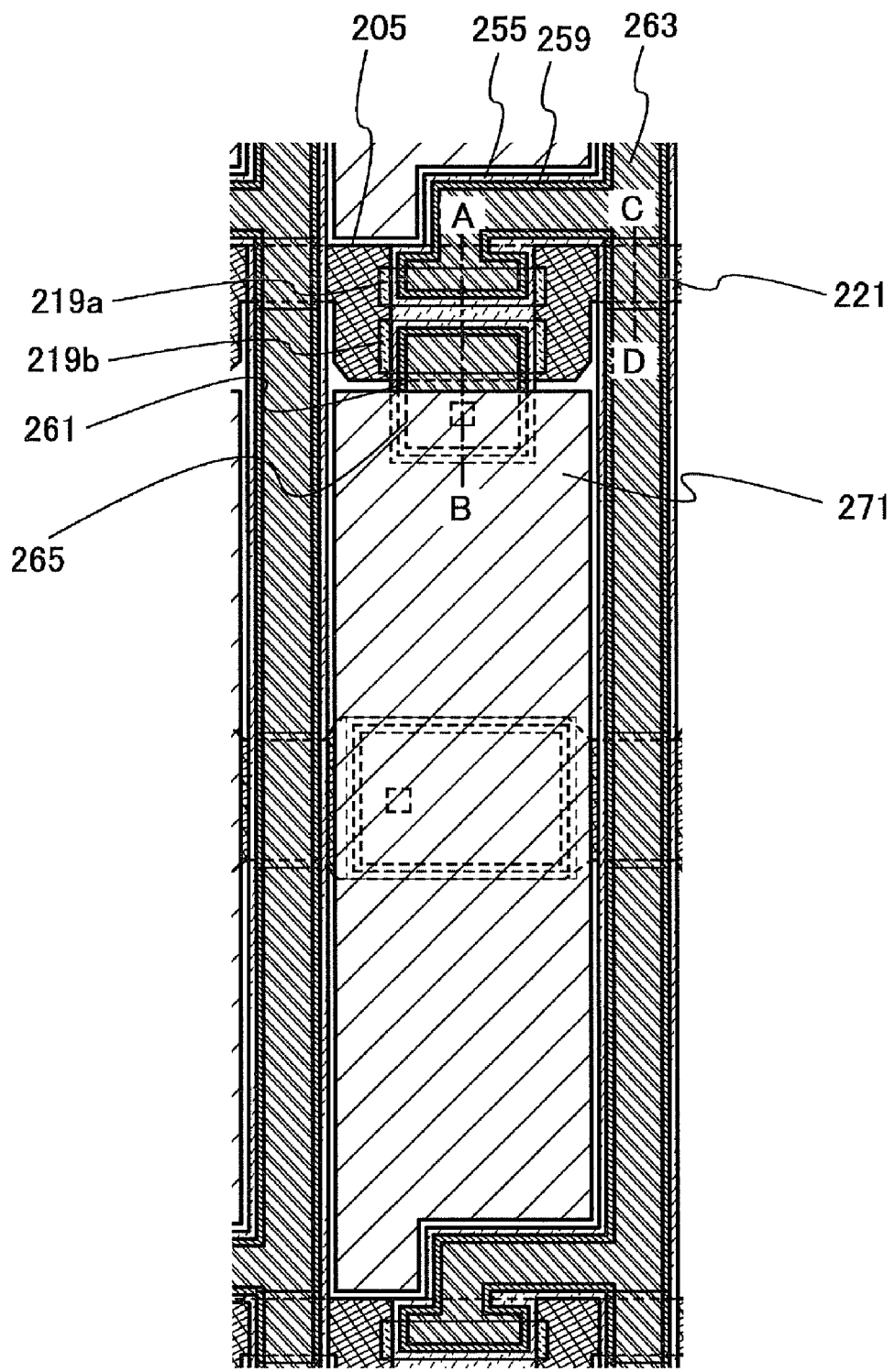
FIG. 10 is a top view illustrating a manufacturing process of a thin film transistor.

Typical examples of the multi-tone mask include a gray-tone mask 159a as illustrated in FIG. 9A and a half-tone mask 159b as illustrated in FIG. 9C.

As illustrated in FIG. 9A, the gray-tone mask 159a includes a light-transmitting substrate 163 provided with a light-blocking portion 164 and a diffraction grating 165. The light transmittance of the light-blocking portion 164 is 0%. On the other hand, the diffraction grating 165 has a light-transmitting portion in a slit form, a dot form, a mesh form, or the like with intervals, which are less than or equal to the resolution limit for light used for the exposure; thus, the light transmittance can be controlled. The diffraction grating 165 can be in a slit form, a dot form, or a mesh form with either regular or irregular intervals.

For the light-transmitting substrate 163, a light-transmitting substrate such as a quartz substrate can be used. The light-blocking portion 164 and the diffraction grating 165 can be formed using a light-blocking material such as chromium or chromium oxide, which absorbs light.

When the gray-tone mask 159a is irradiated with light for exposure, light transmittance 166 of the light-blocking portion 164 is 0% and that of a region where neither the light-blocking portion 164 nor the diffraction grating 165 is provided is 100%, as illustrated in FIG. 9B. The light transmittance of the diffraction grating 165 can be controlled in the range of 10% to 70%. The light transmittance of the diffraction grating 165 can be controlled with an interval or a pitch of slits, dots, or meshes of the diffraction grating 165.

As illustrated in FIG. 9C, the half-tone mask 159b includes a light-transmitting substrate 163 provided with a semi-transmissive portion 167 and a light-blocking portion 168. The semi-transmissive portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 9D:
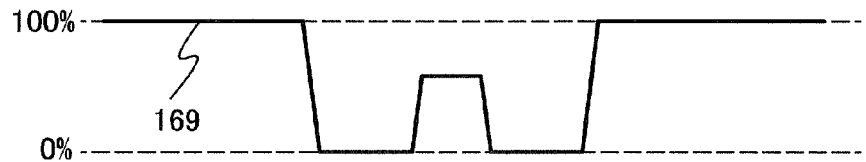

When the half-tone mask 159b is irradiated with light for exposure, light transmittance 169 of the light-blocking portion 168 is 0% and that of a region where neither the light-blocking portion 168 nor the semi-transmissive portion 167 is provided is 100%, as illustrated in FIG. 9D. Further, the light transmittance in the semi-transmissive portion 167 can be controlled in the range of 10% to 70%. The light transmittance of the semi-transmissive portion 167 can be controlled with a material of the semi-transmissive portion 167.

After the light exposure using the multi-tone mask, development is performed, whereby the resist mask 229 with regions having different thicknesses can be formed, as illustrated in FIG. 7D.

Figure 7E:
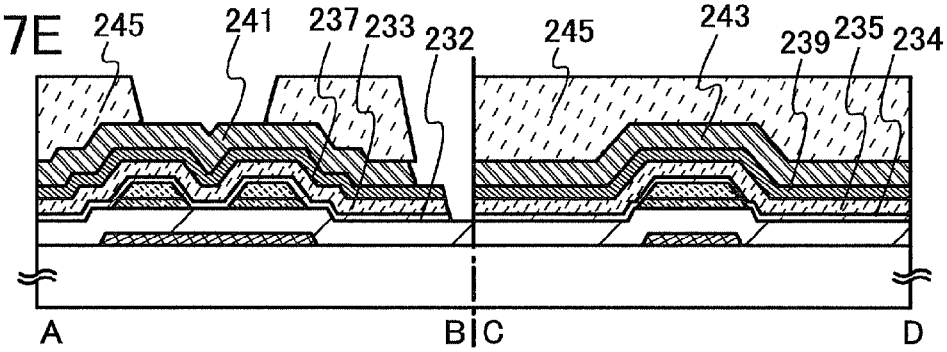

Next, by using the resist mask 229, the microcrystalline semiconductor layer 222, the amorphous semiconductor layer 223, the impurity semiconductor layer 225 to which the impurity element imparting one conductivity type is added, and the conductive layer 227 are etched to be separated. Consequently, microcrystalline semiconductor layers 232 and 234, amorphous semiconductor layers 233 and 235, impurity semiconductor layers 237 and 239 to which the impurity element imparting one conductivity type is added, and conductive layers 241 and 243 as illustrated in FIG. 7E can be formed.

Next, ashing is performed on the resist mask 229. Consequently, the area and the thickness of the resist are reduced. At this time, the resist in a region with a small thickness (a region overlapping with part of the gate wiring 205) is removed to form a separated resist mask 245 as illustrated in FIG. 7E.

Figure 8A:
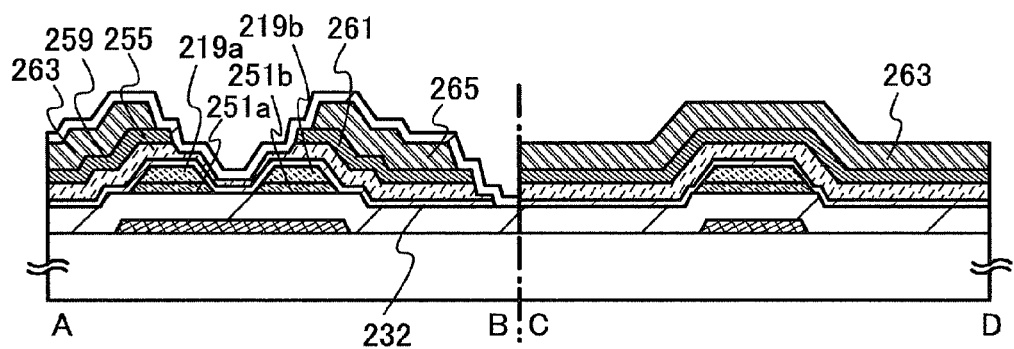
FIGS. 8A to 8C are cross-sectional views illustrating a manufacturing process of a thin film transistor.

Next, the conductive layer 241 is etched to be separated using the resist mask 245. Consequently, a source wiring 263 and a drain electrode 265 as illustrated in FIG. 8A can be formed. By performing wet etching on the conductive layer 241 with the resist mask 245, the conductive layer 241 is etched selectively. Since the conductive layer 241 is isotropically etched, the source wiring 263 and the drain electrode 265 which have a smaller area than the resist mask 245 can be formed.

In a region where the gate wiring 205 and the impurity semiconductor layer 239 to which the impurity element imparting one conductivity type is added intersect, the conductive layer 217, the buffer layer 221, the microcrystalline semiconductor layer 234, and the amorphous semiconductor layer 235 are formed in addition to the gate insulating film 209; and a distance between the gate wiring 205 and the impurity semiconductor layer 239 to which the impurity element imparting one conductivity type is added is increased. Therefore, the parasitic capacitance in the region where the gate wiring 205 and the impurity semiconductor layer 239 to which the impurity element imparting one conductivity type is added intersect can be reduced.

Next, with the use of the resist mask 245, the impurity semiconductor layer 237 to which the impurity element imparting one conductivity type is added is etched to form a pair of impurity semiconductor layers 259 and 261 to which the impurity element imparting one conductivity type is added. Note that in the etching step, part of the amorphous semiconductor layer 233 is also etched to be an amorphous semiconductor layer 255.

In this embodiment, end portions of the source wiring 263 and the drain electrode 265 are not aligned with end portions of the pair of impurity semiconductor layers 259 and 261 to which the impurity element imparting one conductivity type is added. The end portions of the pair of impurity semiconductor layers 259 and 261 to which the impurity element imparting one conductivity type is added are positioned on the outer side than the end portions of the source wiring 263 and the drain electrode 265, respectively. After that, the resist mask 245 is removed.

Next, the exposed amorphous semiconductor layer 255 may be irradiated with $H_2O$ plasma. Typically, exposed portions of the amorphous semiconductor layer 255, the pair of impurity semiconductor layers 259 and 261 to which the impurity element imparting one conductivity type is added, the source wiring 263, and the drain electrode 265 are irradiated with radicals which are generated by plasma discharging of water that is vaporized, so that operation at high speed of the thin film transistor can be performed and an on-state current can be further increased. In addition, an off-state current can be reduced.

By the above process, a thin film transistor can be formed. In this embodiment, the conductive layer 211, the buffer layer 213, the microcrystalline semiconductor layer 222, and the amorphous semiconductor layer 223 are formed in the reaction chamber 100b; therefore, each film has high quality.

Figure 8B:
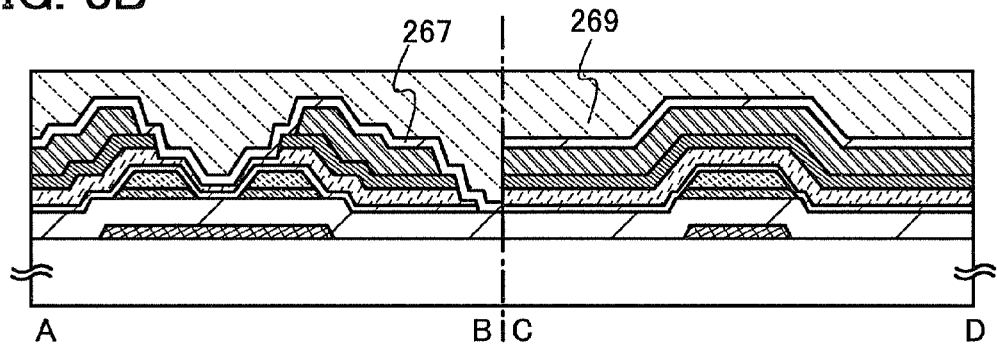

Next, as illustrated in FIG. 8B, a protective insulating layer 267 is formed over the source wiring 263, the drain electrode 265, the gate insulating film 209, and the like. The protective insulating layer 267 can be formed using a silicon nitride layer, a silicon nitride oxide layer, a silicon oxide layer, or a silicon oxynitride layer. The protective insulating layer 267 prevents a contaminant impurity such as an organic substance, a metal, or water vapor included in the atmosphere from entering; thus, a dense film is preferably used for the protective insulating layer 267.

Figure 8C:
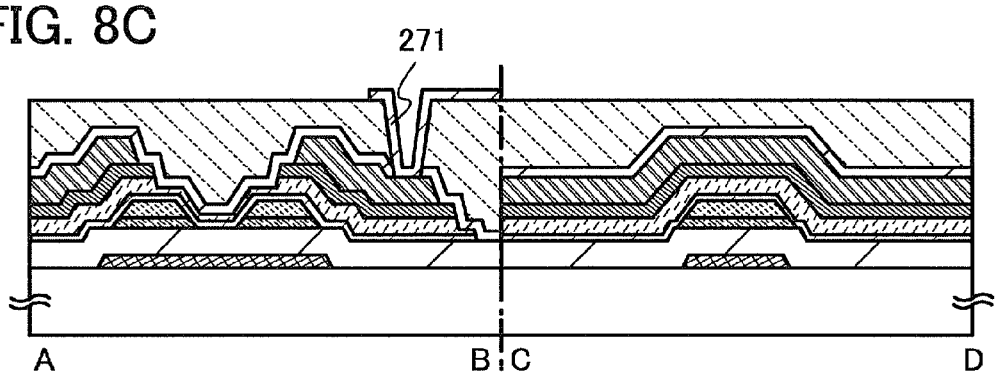

Next, a planarizing layer 269 may be formed over the protective insulating layer 267. The planarizing layer 269 can be formed using an organic insulating layer of an acrylic resin, polyimide, an epoxy resin, a siloxane polymer, or the like. In this embodiment, the planarizing layer 269 is formed using a photosensitive organic resin. Then, the planarizing layer 269 is exposed to light using a fourth photomask and developed so as to expose part of the protective insulating layer 267 as illustrated in FIG. 8C. Then, the protective insulating layer 267 is etched using the planarizing layer 269, to form a contact hole which exposes part of the drain electrode 265.

Next, a pixel electrode 271 is formed in the contact hole. In this embodiment, a conductive layer is formed over the planarizing layer 269, and a resist is applied to the conductive layer. Then, a resist mask is formed by a photolithography process using a fifth photomask and the conductive layer is etched with the resist mask, so that the pixel electrode 271 is formed.

For the pixel electrode 271, a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Further, the pixel electrode 271 can also be formed using a conductive composition including a conductive high molecule (also referred to as a conductive polymer). The pixel electrode formed using the conductive composition preferably has a sheet resistance less than or equal to 10000 $\Omega$/square and a light transmittance greater than or equal to 70% at a wavelength of 550 nm. Further, the resistivity of the conductive high molecule included in the conductive composition is preferably less than or equal to 0.1 $\Omega\cdot$cm.

As the conductive high molecule, a so-called $\pi$-electron conjugated conductive high molecule can be used. For example, polyaniline or a derivative thereof, polypyrrole or a derivative thereof, polythiophene or a derivative thereof, a copolymer of two or more kinds of them, and the like can be given.

In this embodiment, as the pixel electrode 271, an ITO film is formed by a sputtering method and then a resist is applied to the ITO film. Next, the resist is exposed to light and developed using a fifth photomask to form a resist mask. Then, the pixel electrode 271 is formed by etching the ITO film using the resist mask. After that, the resist mask is removed. Note that FIG. 8C corresponds to the cross-sectional views taken along lines A-B and C-D of FIG. 10. Although, in the thin film transistor illustrated in FIG. 10, the source region and the drain region facing each other are parallel in a top view shape of a channel formation region, a thin film transistor whose top view shape of the channel formation region is a C (U) shape may also be manufactured instead of the thin film transistor illustrated in FIG. 10.

In this manner, a thin film transistor in which an off-state current is small, an on-state current is large, and operation at high speed can be performed can be manufactured. In addition, an element substrate having the thin film transistor as a switching element of a pixel electrode can be manufactured. Note that in this embodiment, the number of photomasks is increased by one compared to a manufacturing process of a general inverted-staggered thin film transistor, for etching the conductive layer and the buffer layer into predetermined shapes. However, the number of photomasks can be reduced by one in this process because the multi-tone mask is used for photomasks for etching to form the pair of amorphous semiconductor layers, the pair of impurity semiconductor layers to which the impurity element imparting one conductivity type is added, and the wirings with predetermined shapes. Therefore, the number of masks is not increased in the whole manufacturing process.

Embodiment 4

In this embodiment, a thin film transistor having a structure which is partially different from that of Embodiment 3 will be described with reference to FIG. 11.

Whereas the example in which the microcrystalline semiconductor layer 232 and the amorphous semiconductor layer 255 are stacked is described in Embodiment 3, an example in which only the amorphous semiconductor layer 255 is formed is described in this embodiment. Other portions are the same as those in Embodiment 3; thus, the same portions as those in FIGS. 7A to 7E and FIGS. 8A to 8C are denoted by the same reference numerals in FIG. 11. In addition, the manufacturing method in Embodiment 3 can be employed.

As the amorphous semiconductor layer 255, an amorphous silicon film with a thickness of 80 nm is formed under the following conditions: a high-frequency power source with a frequency of 60 MHz is used, 30 W of power is applied, the gap between the electrodes is 25 mm, the flow rate of a silane gas is 60 sccm, the pressure is 28 Pa, and the substrate temperature is 200° C.

Figure 11:
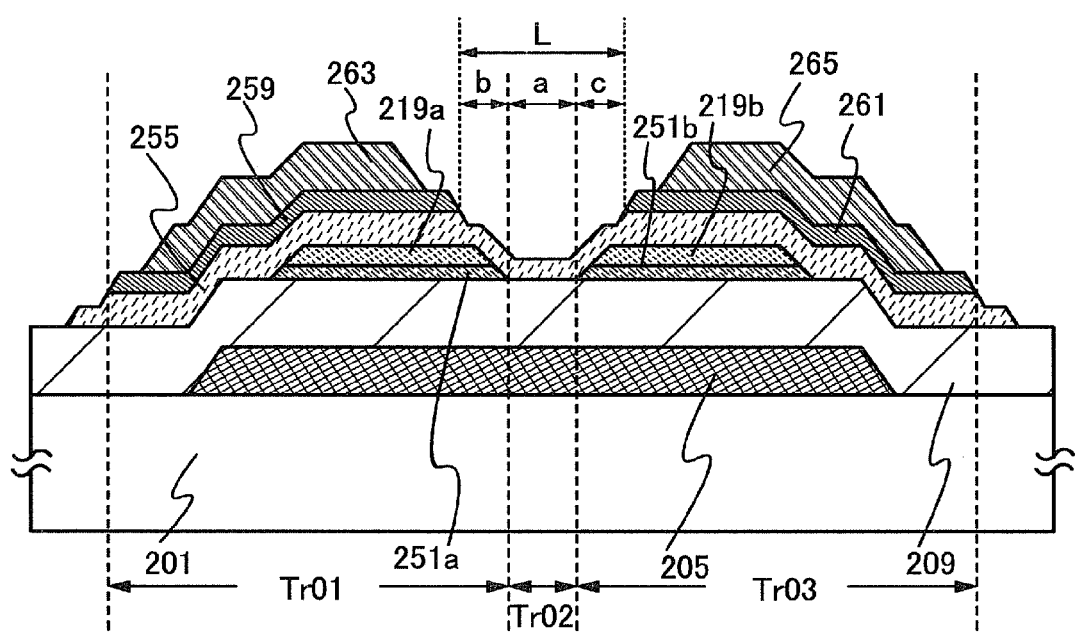
FIG. 11 is a cross-sectional view illustrating a manufacturing process of a thin film transistor.

Now, the structure of the thin film transistor illustrated in FIG. 11 is described.

In the thin film transistor illustrated in FIG. 11, a first thin film transistor Tr01, a second thin film transistor Tr02, and a third thin film transistor Tr03 are connected. The first thin film transistor Tr01 includes a gate electrode 205, a gate insulating film 209, a conductive layer 251a, a buffer layer 219a, an amorphous semiconductor layer 255, an impurity semiconductor layer 259 to which an impurity element imparting one conductivity type is added, and a wiring 263. The second thin film transistor Tr02 includes the gate electrode 205, the gate insulating film 209, and the amorphous semiconductor layer 255. The third thin film transistor Tr03 includes the gate electrode 205, the gate insulating film 209, a conductive layer 251b, a buffer layer 219b, the amorphous semiconductor layer 255, an impurity semiconductor layer 261 to which the impurity element imparting one conductivity type is added, and a wiring 265.

The second thin film transistor Tr02 is a thin film transistor in which the amorphous semiconductor layer 255 is used as a channel formation region. On the other hand, regions where carriers flow in the first thin film transistor Tr01 and the third thin film transistor Tr03 are the conductive layer 251a and the conductive layer 251b, respectively. The electric conductivity of these regions each are 0.9 to 2 (S/cm), and the resistivity thereof is lower than those of an amorphous semiconductor layer and a microcrystalline semiconductor layer. Therefore, even when a positive voltage which is lower than the threshold voltage of the second thin film transistor Tr02 is applied to the gate electrode 205, the conductive layers 251a and 251b are in a state in which a large number of carriers are induced. On applying a positive voltage greater than or equal to the threshold voltage of the second thin film transistor Tr02 to the gate electrode 205, the second thin film transistor Tr02 is turned on, so that a large number of carriers induced in the conductive layers 251a and 251b flow into the wiring 263 in the first thin film transistor Tr01 or the wiring 265 in the third thin film transistor Tr03.

Channel length L of the thin film transistor of this embodiment is the sum of a distance a between the conductive layers 251a and 251b, a distance b between the end portion of the impurity semiconductor layer 259 to which the impurity element imparting one conductivity type is added and the end portion of the conductive layer 251a, and a distance c between the end portion of the impurity semiconductor layer 261 to which the impurity element imparting one conductivity type is added and the end portion of the conductive layer 251b. With respect to the channel length L, the distance b between the end portion of the impurity semiconductor layer 259 to which the impurity element imparting one conductivity type is added and the end portion of the conductive layer 251a and the distance c between the end portion of the impurity semiconductor layer 261 to which the impurity element imparting one conductivity type is added and the end portion of the conductive layer 251b are each made to be large, and the distance a between the conductive layers 251a and 251b is made to be small, so that an on-state current is increased.

In addition, in the thin film transistor described in this embodiment, the conductive layers 251a and 251b are etched using a resist mask formed by a photolithography process using one photomask. Therefore, alignment of a photomask with accuracy at a submicron level is not needed, leading to reduction in variation of the distance a between the conductive layers 251a and 251b. In addition, the distance a can be about the resolution limit of an exposure apparatus. Further, with the use of a phase-shifting mask, the distance a can be reduced to the distance less than or equal to the resolution limit of the exposure apparatus. Since a region of the amorphous semiconductor layer 255 with the distance a between the conductive layers 251a and 251b serves as a channel of the second thin film transistor which operates when a positive gate voltage is applied, variation can be reduced and an on-state current and mobility of the thin film transistor can be increased.

Since the channel length of the second thin film transistor Tr02 (i.e., the distance a) can be reduced according to this embodiment, it is preferable that the thickness of the gate insulating film be reduced so as to prevent short-channel effect in the second thin film transistor Tr02.

On the other hand, when a negative voltage is applied to the gate electrode 205, even if carriers are induced in the conductive layers 251a and 251b, the second thin film transistor Tr02 obstructs a flow of an off-state current. This is because an off-state current of the second thin film transistor Tr02, which is formed using an amorphous semiconductor layer, is low.

Accordingly, the thin film transistor described in this embodiment is a thin film transistor in which an on-state current is large, mobility is high, and an off-state current is small.

Further, the surface of the amorphous semiconductor layer 255 by which the source region is connected to the drain region (a back-channel) has roughness and is long, so that a path of a leakage current flowing through the surface of the amorphous semiconductor layer 255 between the source region and the drain region becomes long. As a result of this, a leakage current flowing through the surface of the amorphous semiconductor layer 255 can be reduced.

Further, since the amorphous semiconductor layer 255 is formed in addition to the gate insulating film between the gate electrode 205 and the impurity semiconductor layers 259 and 261 to which the impurity element imparting one conductivity type is added, a distance between the gate electrode 205 and the impurity semiconductor layers 259 and 261 to which the impurity element imparting one conductivity type is added is increased. Hence, the parasitic capacitance to be generated between the gate electrode 205 and the impurity semiconductor layers 259 and 261 to which the impurity element imparting one conductivity type is added can be decreased. In particular, a thin film transistor in which voltage drop on the drain side is decreased can be formed. Therefore, the response speed of pixels can be increased in a display device using this structure. In particular, in the case of a thin film transistor formed in a pixel of a liquid crystal display device, the response speed of a liquid crystal material can be increased because drop of the drain voltage can be reduced.

Note that this embodiment can be combined with Embodiment 1, 2, or 3.

Embodiment 5

In this embodiment, a thin film transistor having a structure which is partially different from that of Embodiment 3 will be described with reference to FIG. 12.

Whereas the example in which the conductive layers 251a and 251b and the buffer layers 219a and 219b are stacked is described in Embodiment 3, an example in which only the conductive layers 251a and 251b are formed is described in this embodiment. Other portions are the same as those in Embodiment 3; thus, the same portions as those in FIGS. 7A to 7E and FIGS. 8A to 8C are denoted by the same reference numerals in FIG. 12. In addition, the manufacturing method in Embodiment 3 can be employed.

Figure 12:
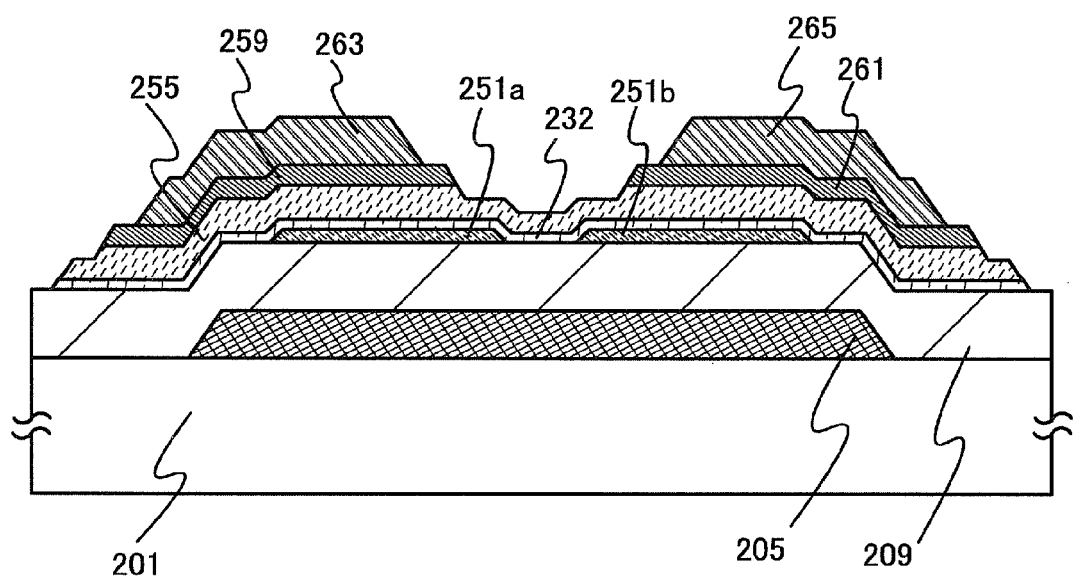
FIG. 12 is a cross-sectional view illustrating a manufacturing process of a thin film transistor.

In a thin film transistor illustrated in FIG. 12, a gate electrode 205 is formed over a substrate 201, a gate insulating film 209 is formed over the gate electrode 205, and conductive layers 251a and 251b which are provided with a space therebetween are formed over the gate insulating film 209. Further, a microcrystalline semiconductor layer 232 which covers the side and top surfaces of the conductive layers 251a and 251b is formed, and an amorphous semiconductor layer 255 is formed over the microcrystalline semiconductor layer 232. The shapes of the microcrystalline semiconductor layer 232 and the amorphous semiconductor layer 255 are about the same. A pair of impurity semiconductor layers 259 and 261 to which an impurity element imparting one conductivity type is added are formed over the amorphous semiconductor layer 255, and wirings 263 and 265 are formed over the impurity semiconductor layers 259 and 261 to which the impurity element imparting one conductivity type is added, respectively.

The microcrystalline semiconductor layer 232 can be formed using a microcrystalline silicon layer, a microcrystalline silicon germanium layer, or a microcrystalline germanium layer. An impurity element serving as a donor may be added to the microcrystalline semiconductor layer 232 at a lower concentration than the concentration of an impurity element serving as a donor included in a semiconductor layer which can be used for the conductive layers 251a and 251b. With the impurity element serving as a donor added at a lower concentration, the threshold voltage of the thin film transistor can be controlled.

By reducing the thickness of the microcrystalline semiconductor layer 232 to 5 nm to 30 nm, preferably 10 nm to 20 nm, an off-state current of the thin film transistor can be kept small. Further, the amorphous semiconductor layer 255 is formed between the microcrystalline semiconductor layer 232 and the impurity semiconductor layers 259 and 261 to which the impurity element imparting one conductivity type is added, whereby an off-state current can be reduced compared to a thin film transistor formed using a microcrystalline semiconductor layer. Further, with the microcrystalline semiconductor layer 232 the resistivity of which is lower than that of an amorphous semiconductor layer, provided between the amorphous semiconductor layer 255 and the gate insulating film 209, flowing of carriers is facilitated and high-speed operation of the thin film transistor is possible.

Further, by forming a silicon oxide layer or a silicon oxynitride layer as the gate insulating film 209 and a microcrystalline silicon layer as the microcrystalline semiconductor layer 232, fluctuation of the threshold voltage can be reduced compared to the case where the gate insulating film 209 is formed using a silicon nitride layer and an amorphous semiconductor layer is formed without forming a microcrystalline semiconductor layer.

This embodiment can be combined with any of Embodiments 1 to 4.

Embodiment 6

In this embodiment, a structure of a scan line input terminal portion and a signal line input terminal portion which are provided in the peripheral portion of an element substrate 300 illustrated in FIG. 13 will be described with reference to FIGS. 14A and 14B. FIGS. 14A and 14B are cross-sectional views of a scan line input terminal portion and a signal line input terminal portion which are provided in the peripheral portion of a substrate 201, and a thin film transistor of a pixel portion. The same portions as those in FIGS. 7A to 7E and FIGS. 8A to 8C are denoted by the same reference numerals in FIGS. 14A and 14B.

Note that in the case of an active matrix display device provided with a thin film transistor for controlling the potential of a pixel electrode in a pixel provided in a pixel portion, a scan line is connected to a gate electrode, or part of the scan line serves as the gate electrode. Therefore, the scan line is also referred to as a gate wiring 205. In addition, a signal line is connected to a source of the thin film transistor; therefore, the signal line is also referred to as a source wiring 263. However, when the signal line is connected to a drain of the thin film transistor, the signal line can serve as a drain wiring.

Figure 13:
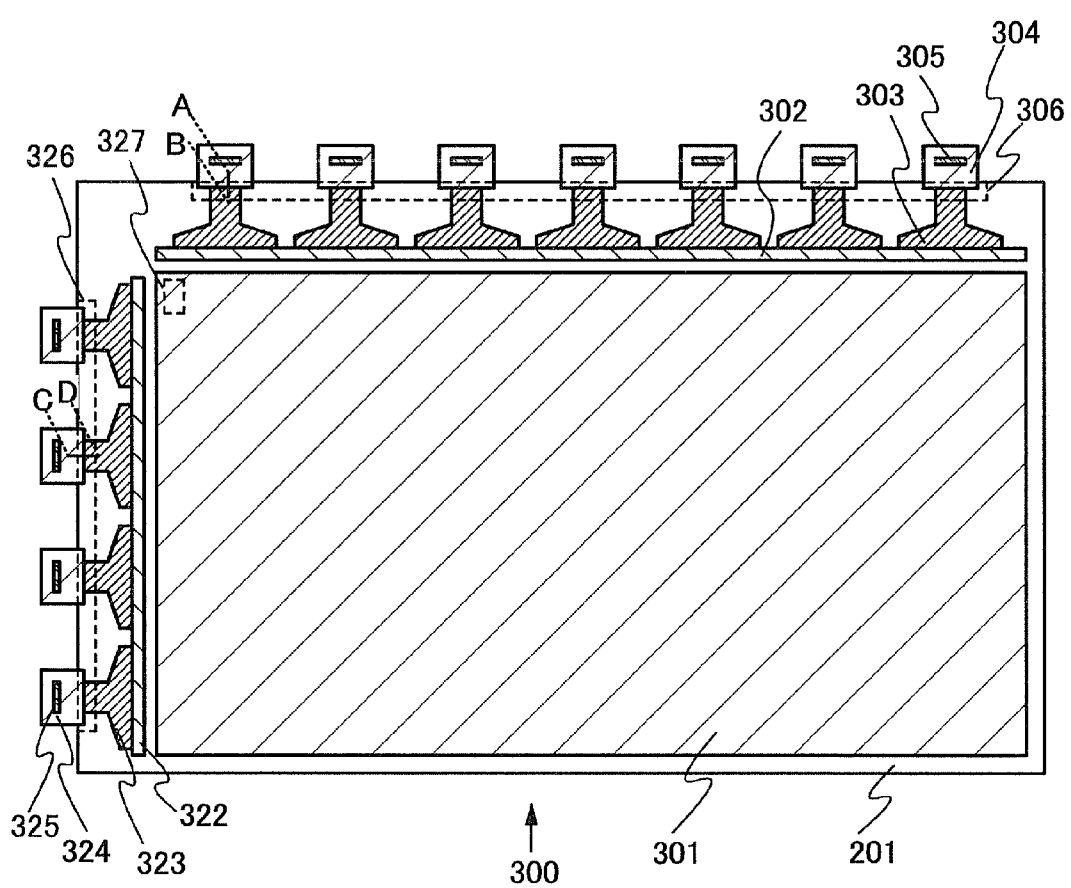
FIG. 13 is a plan view illustrating an element substrate.
Figure 14A:
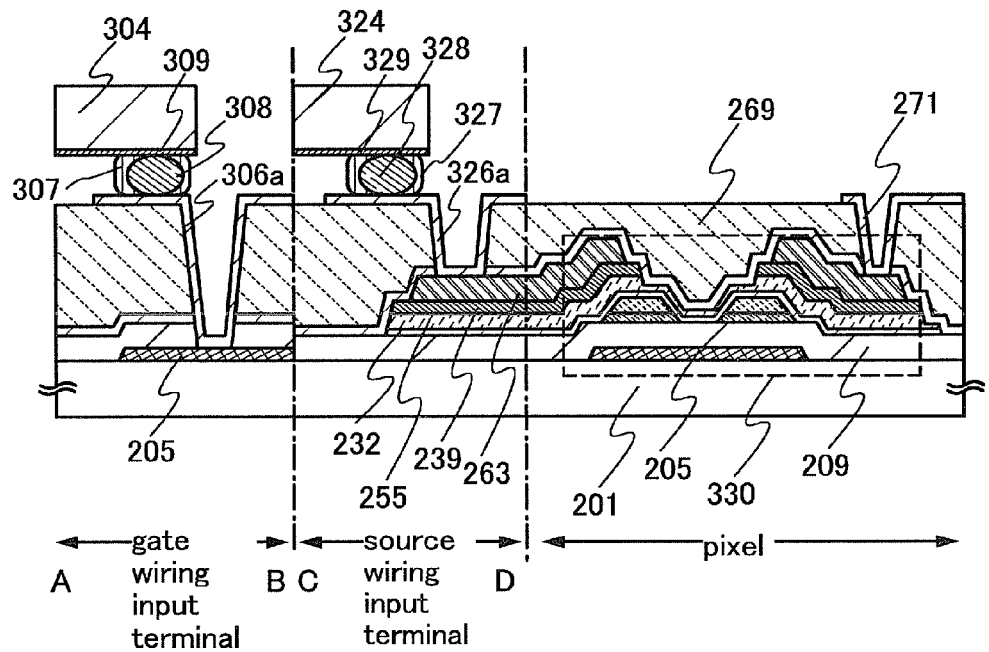
FIGS. 14A and 14B are cross-sectional views each illustrating a terminal portion and a pixel portion of an element substrate.
Figure 14B:
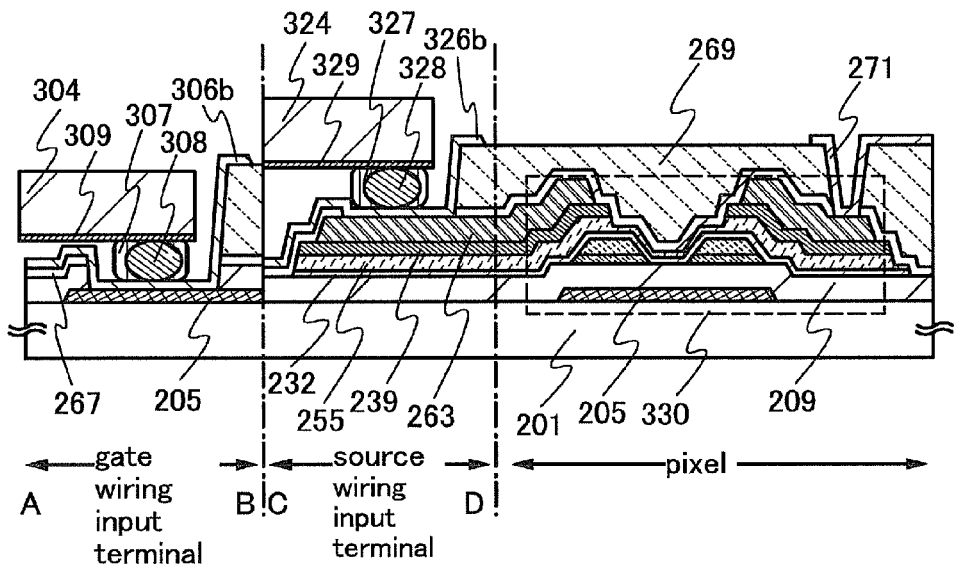

As illustrated in FIG. 13, a pixel portion 301 is provided, and protective circuits 302 and 322, a signal line 323, and a scan line 303 are provided between the pixel portion 301 and the peripheral portion of the substrate 201. In addition, although not illustrated, a signal line and a scan line are provided, from the protective circuits 302 and 322 to the pixel portion 301. A signal line input terminal portion 326 and a scan line input terminal portion 306 are provided at the end portion of the signal line 323 and the end portion of the scan line 303, respectively. An FPC 324 and an FPC 304 are connected to a terminal of the signal line input terminal portion 326 and a terminal of the scan line input terminal portion 306, respectively, and a signal line driver circuit 325 and a scan line driver circuit 305 are provided for the FPC 324 and the FPC 304, respectively. In addition, although not illustrated, pixels 327 are arranged in matrix in the pixel portion 301.

In FIG. 14A, a scan line input terminal 306a is connected to the gate wiring 205 of a thin film transistor 330. In addition, a signal line input terminal 326a is connected to the source wiring 263.

The scan line input terminal 306a and the signal line input terminal 326a are each formed using the same layer as that for a pixel electrode 271 of the thin film transistor 330 in the pixel portion. In addition, the scan line input terminal 306a and the signal line input terminal 326a are formed over a planarizing layer 269 which is formed over the source wiring 263. In addition, over the planarizing layer 269, the scan line input terminal 306a and the signal line input terminal 326a are connected to a wiring 309 and a wiring 329 of the FPC 304 and the FPC 324, respectively, with respective conductive particles 308 and 328 of anisotropic conductive adhesives 307 and 327 interposed therebetween.

Note that although the gate wiring 205 and the scan line input terminal 306a are connected in this embodiment, a conductive layer formed using the same layer as that for the source wiring 263 may be provided between the gate wiring 205 and the scan line input terminal 306a.

In FIG. 14B, a scan line input terminal 306b is connected to the gate wiring 205 of the thin film transistor 330. In addition, a signal line input terminal 326b is connected to the source wiring 263 of the thin film transistor 330.

The scan line input terminal 306b and the signal line input terminal 326b are each formed using the same layer as that for the pixel electrode 271 of the thin film transistor 330 in the pixel portion. In addition, the scan line input terminal 306b and the signal line input terminal 326b are formed over the planarizing layer 269 and a protective insulating layer 267. In addition, in openings of the planarizing layer 269 and the protective insulating layer 267, the scan line input terminal 306b and the signal line input terminal 326b are connected to the wiring 309 and the wiring 329 of the FPC 304 and the FPC 324, respectively, with the respective conductive particles 308 and 328 of the anisotropic conductive adhesives 307 and 327 interposed therebetween.

The level of the signal line input terminal 326b which is connected to the source wiring 263 is elevated because a microcrystalline semiconductor layer 232, an amorphous semiconductor layer 255, and an impurity semiconductor layer 239 to which an impurity element imparting one conductivity type is added are formed in addition to a gate insulating film 209 between the substrate 201 and the source wiring 263. Therefore, the signal line input terminal 326b and the wiring 329 of the FPC 324 are easily connected to each other.

Note that this embodiment can be combined with any of Embodiments 1 to 5.

Embodiment 7

Hereinafter, a structure of a display panel which is an embodiment of a display device of the present invention will be described.

Figure 15A:
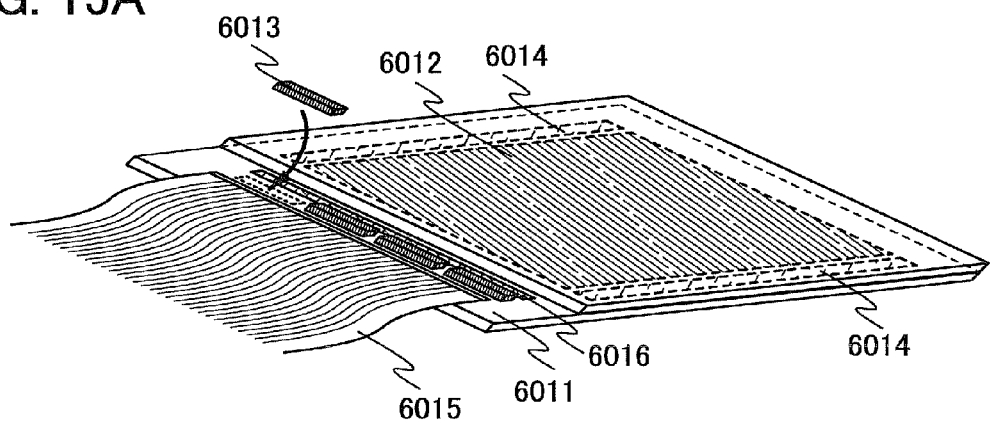
FIGS. 15A to 15C are perspective views each illustrating a display panel.

FIG. 15A illustrates an embodiment of a display panel in which a pixel portion 6012 formed over a substrate 6011 is connected to a signal line driver circuit 6013 which is formed separately. An element substrate over which the pixel portion 6012, a protective circuit 6016, and a scan line driver circuit 6014 are formed is formed using the element substrate described in the above embodiment. By forming the signal line driver circuit using a thin film transistor which has higher field-effect mobility than a thin film transistor using an amorphous semiconductor layer, an operation of the signal line driver circuit which demands higher driving frequency than the scan line driver circuit can be stabilized. Note that the signal line driver circuit 6013 may be formed using a transistor using a single crystal semiconductor, a thin film transistor using a polycrystalline semiconductor, or a transistor using SOI. The transistor using SOI includes, in its category, a transistor using a single crystal semiconductor layer provided over a glass substrate. The pixel portion 6012, the signal line driver circuit 6013, and the scan line driver circuit 6014 are each supplied with potential of a power source, various signals, and the like via an FPC 6015. Between the signal line driver circuit 6013 and the FPC 6015, or between the signal line driver circuit 6013 and the pixel portion 6012, the protective circuit 6016 formed using the thin film transistor described in any of Embodiments 1 to 5 may be provided. The protective circuit 6016 may also be formed using one or a plurality of elements selected from a thin film transistor, a diode, a resistor, a capacitor, and the like instead of the thin film transistor described in any of Embodiments 1 to 5.

The signal line driver circuit and the scan line driver circuit may both be formed over the same substrate as that for the pixel portion.

Figure 15B:
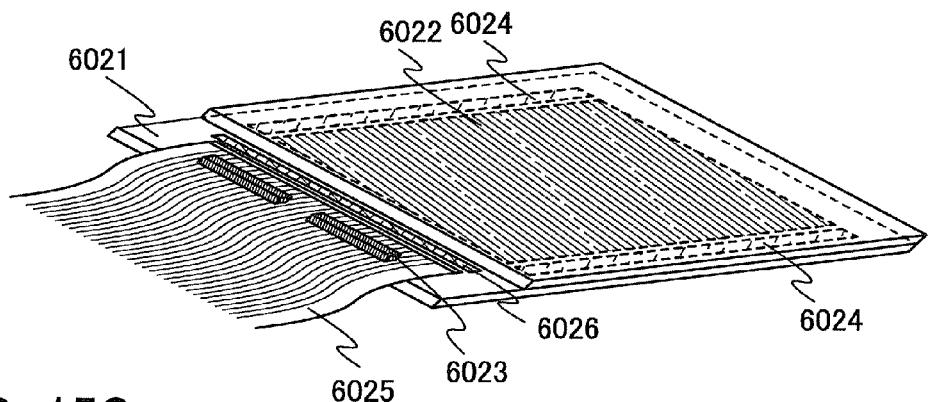

When the driver circuit is separately formed, a substrate provided with the driver circuit is not necessarily attached to a substrate provided with the pixel portion; for example, the substrate provided with the driver circuit may be attached to the FPC. FIG. 15B illustrates an embodiment of a display panel in which a signal line driver circuit 6023 is formed separately and an FPC is connected to an element substrate where a pixel portion 6022, a protective circuit 6026, and a scan line driver circuit 6024 are formed over a substrate 6021. The pixel portion 6022, the protective circuit 6026, and the scan line driver circuit 6024 are each formed using the thin film transistor described in the above embodiment. The signal line driver circuit 6023 is connected to the pixel portion 6022 via an FPC 6025 and the protective circuit 6026. The pixel portion 6022, the signal line driver circuit 6023, and the scan line driver circuit 6024 are each supplied with potential of a power source, various signals, and the like via the FPC 6025. The protective circuit 6026 which is formed using the thin film transistor described in any of Embodiments 1 to 5 may be provided between the FPC 6025 and the pixel portion 6022. The protective circuit 6026 may also be formed using one or a plurality of elements selected from a thin film transistor, a diode, a resistor, a capacitor, and the like instead of the thin film transistor described in any of Embodiments 1 to 5.

Figure 15C:
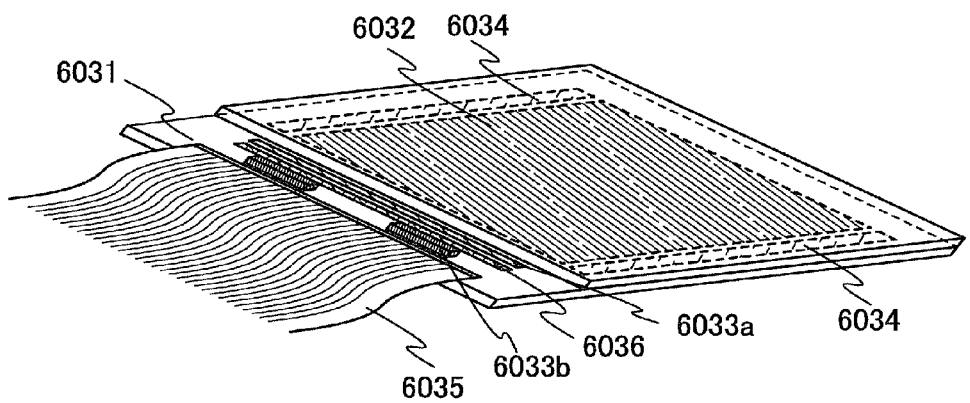

Furthermore, only part of the signal line driver circuit or only part of the scan line driver circuit may be formed over the same substrate as that for the pixel portion, using the thin film transistor described in the above embodiment, and the rest may be formed separately and electrically connected to the pixel portion. FIG. 15C illustrates an embodiment of a display panel in which an analog switch 6033a included in a signal line driver circuit is formed over a substrate 6031 over which a pixel portion 6032 and a scan line driver circuit 6034 are formed, and a shift register 6033b included in the signal line driver circuit is formed separately over another substrate and then attached to the substrate 6031. The pixel portion 6032, a protective circuit 6036, and the scan line driver circuit 6034 each are formed using the thin film transistor described in the above embodiment. The shift register 6033b included in the signal line driver circuit is connected to the pixel portion 6032 via an FPC 6035 and the protective circuit 6036. The pixel portion 6032, the signal line driver circuit, and the scan line driver circuit 6034 are each supplied with potential of a power source, various signals, and the like via the FPC 6035. The protective circuit 6036 which is formed using the thin film transistor described in any of Embodiments 1 to 5 may be provided between the shift register 6033b and the analog switch 6033a. The protective circuit 6036 may also be formed using one or a plurality of elements selected from a thin film transistor, a diode, a resistor, a capacitor, and the like instead of the thin film transistor described in any of Embodiments 1 to 5.

As illustrated in FIGS. 15A to 15C, in the display device of this embodiment, the driver circuitry can be partly or entirely formed over the same substrate as that for the pixel portion, using the thin film transistor described in the above embodiment.

Note that there are no particular limitation on the connection method of a separately formed substrate; a known method such as a COG method, a wire bonding method, or a TAB method can be used. Further, the connection position is not limited to the position illustrated in FIGS. 15A to 15C as long as electrical connection is possible. In addition, a controller, a CPU, a memory, or the like may be formed separately and connected.

The signal line driver circuit includes a shift register and an analog switch. In addition to the shift register and the analog switch, another circuit such as a buffer, a level shifter, or a source follower may be included. The shift register and the analog switch are not necessarily provided; for example, another circuit such as a decoder circuit by which selection of a signal line is possible may be used instead of the shift register, and a latch or the like may be used instead of the analog switch.

Note that this embodiment can be combined with any of Embodiments 1 to 6.

Embodiment 8

An element substrate obtained according to the present invention and a display device or the like formed using the element substrate can be used for an active matrix display panel. That is, the present invention can be applied to all electronic devices which incorporate them in display portions.

Examples of such electronic devices include cameras such as video cameras and digital cameras, head-mounted displays (goggle-type displays), car navigation systems, projectors, car stereos, personal computers, and portable information terminals (e.g., mobile computers, cellular phones, and e-book readers). Examples of these devices are illustrated in FIGS. 16A to 16D.

Figure 16A:
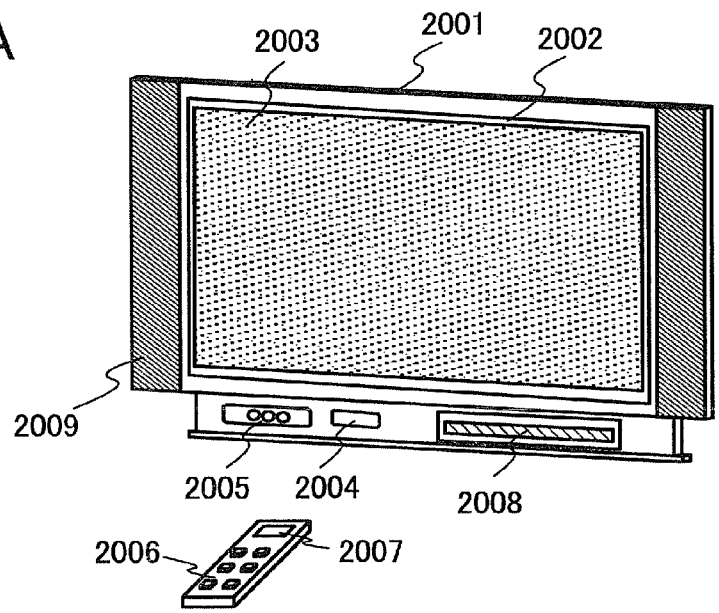
FIGS. 16A to 16D are perspective views each illustrating an electronic device including a display device.

FIG. 16A illustrates a television device. The television device can be completed by incorporating a display panel into a housing as illustrated in FIG. 16A. A main screen 2003 is formed using the display panel, and other accessories such as speaker portions 2009 and operation switches are also provided. In such a manner, the television device can be completed.

As illustrated in FIG. 16A, a display panel 2002 using a display element is incorporated in a housing 2001. In addition to reception of general TV broadcast with the use of a receiver 2005, communication of information can also be performed in one way (from a transmitter to a receiver) or in two ways (between a transmitter and a receiver or between receivers) by connection to a wired or wireless communication network via a modem 2004. The television device can be operated by using a switch built in the housing or a separate remote control unit (means) 2006. A display portion 2007 for displaying information that is output may also be provided in the remote control unit (means) 2006.

Further, the television device may include a sub-screen 2008 formed using a second display panel for displaying channels, sound volume, and the like, in addition to the main screen 2003. In this structure, the main screen 2003 may be formed with a liquid crystal display panel with an excellent viewing angle, and the sub-screen 2008 may be formed with a light-emitting display panel by which display is possible with low power consumption. Alternatively, when reduction in power consumption is prioritized, a structure may be employed in which the main screen 2003 is formed with a light-emitting display panel, the sub-screen 2008 is formed with a light-emitting display panel, and the sub-screen 2008 is turned on and off.

Figure 17:
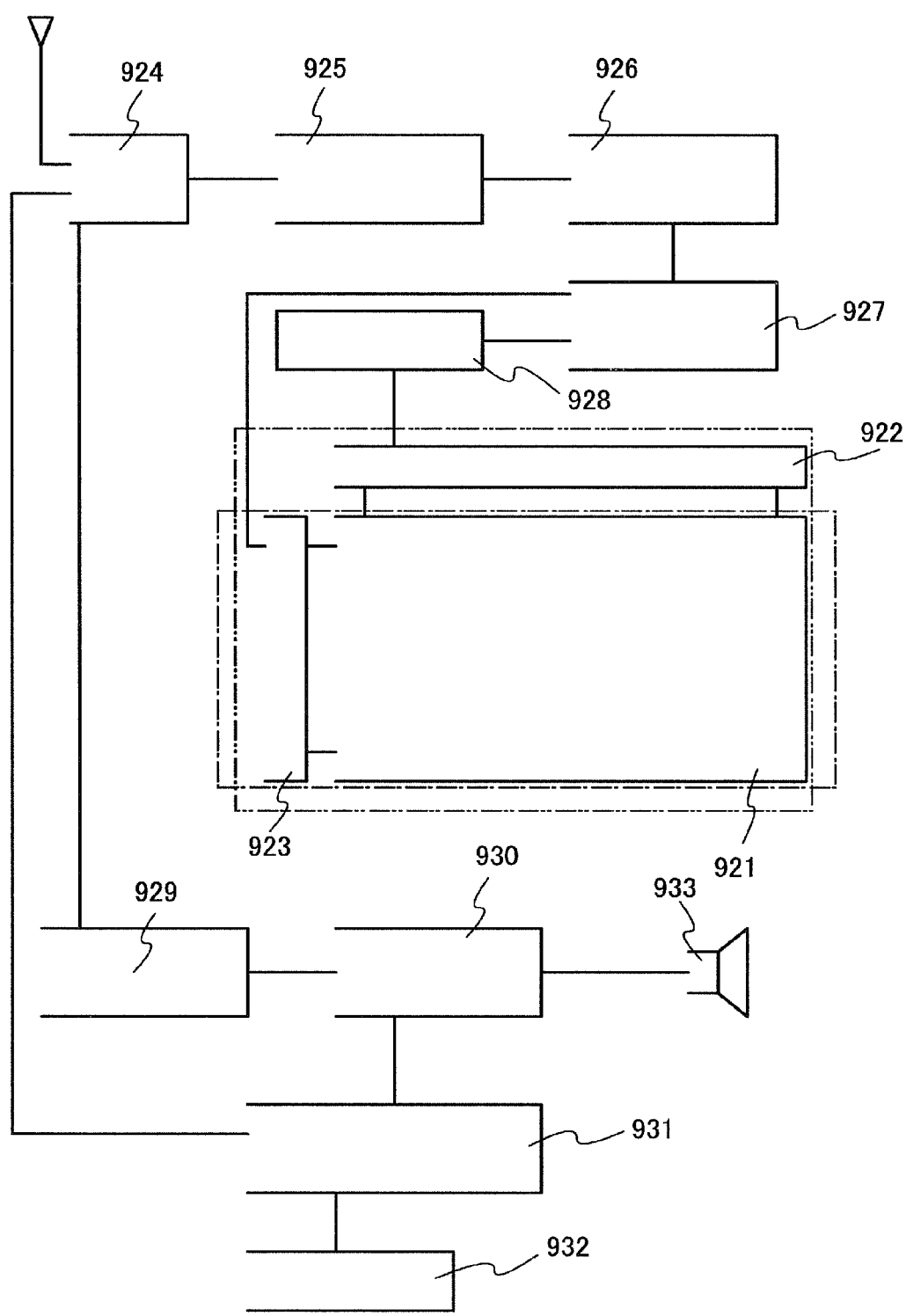
FIG. 17 illustrates an electronic device including a display device.

FIG. 17 is a block diagram illustrating a main structure of the television device. A display panel is provided with a pixel portion 921. A signal line driver circuit 922 and a scan line driver circuit 923 may be mounted on the display panel by a COG method.

As for other external circuits, the television device includes, on the input side of a video signal, a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs signals to each of the scan line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to the television device and can be used as a large-area display medium for various applications such as a monitor of a personal computer, an information display board at a train station, an airport, and the like, and an advertisement display board on the street.

The element substrate described in any of Embodiments 1 to 7 and a display device including the element substrate are applied to the main screen 2003 and the sub-screen 2008, so that mass productivity of the television device can be increased.

Figure 16B:
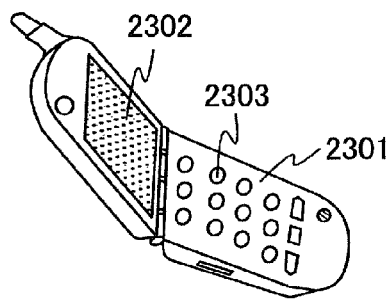

FIG. 16B illustrates one example of a cellular phone 2301. The cellular phone 2301 includes a display portion 2302, operation switches 2303, and the like. The element substrate described in any of the above embodiments and a display device including the element substrate are used for the display portion 2302, so that mass productivity of the cellular phone can be increased.

Figure 16C:
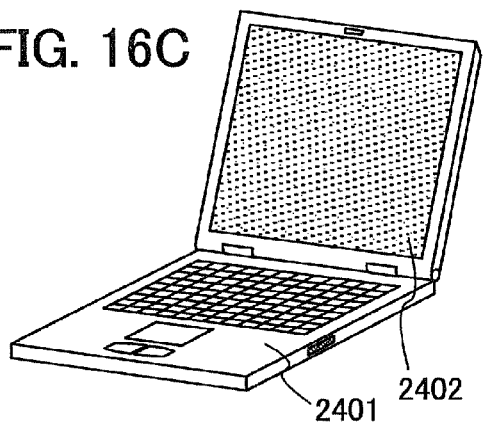

In addition, a mobile computer illustrated in FIG. 16C includes a main body 2401, a display portion 2402, and the like. The element substrate described in any of the above embodiments and a display device including the element substrate are used for the display portion 2402, so that mass productivity of the computer can be increased.

Figure 16D:
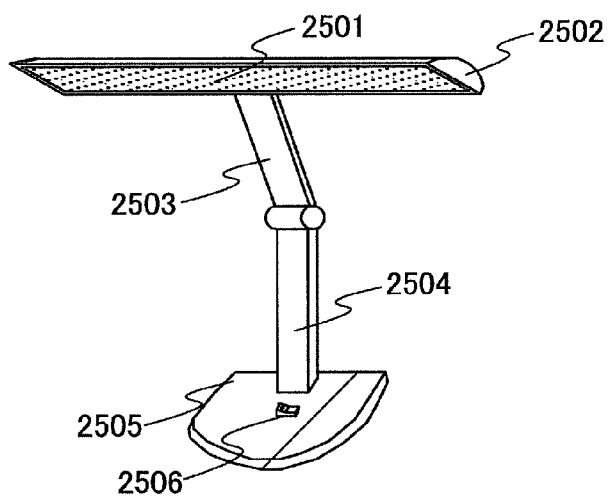

FIG. 16D illustrates a desk lamp (lighting equipment) including a lighting portion 2501, a shade 2502, an adjustable arm 2503, a support 2504, a base 2505, and a power source switch 2506. The desk lamp can be manufactured by applying a light-emitting device according to the present invention to the lighting portion 2501. Note that the lighting equipment also includes a ceiling light, a wall light, and the like. By using the element substrate described in any of Embodiments 1 to 7 and a display device including the element substrate, mass productivity can be increased and inexpensive desk lamps can be provided.

Figure 18A:
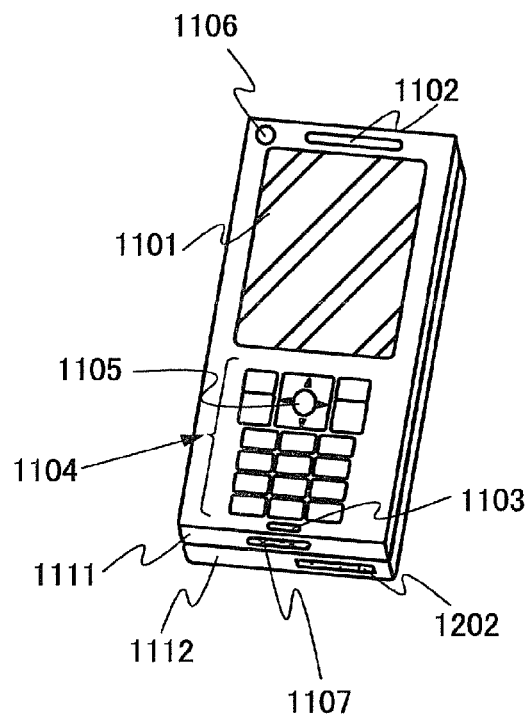
FIGS. 18A to 18C are perspective views each illustrating an electronic device including a display device.
Figure 18B:
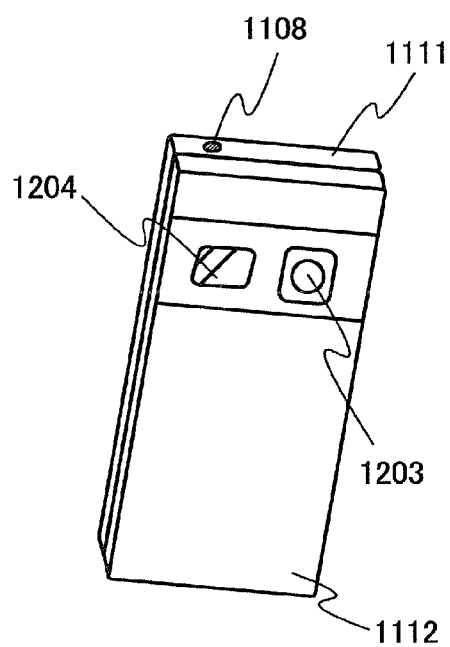
Figure 18C:
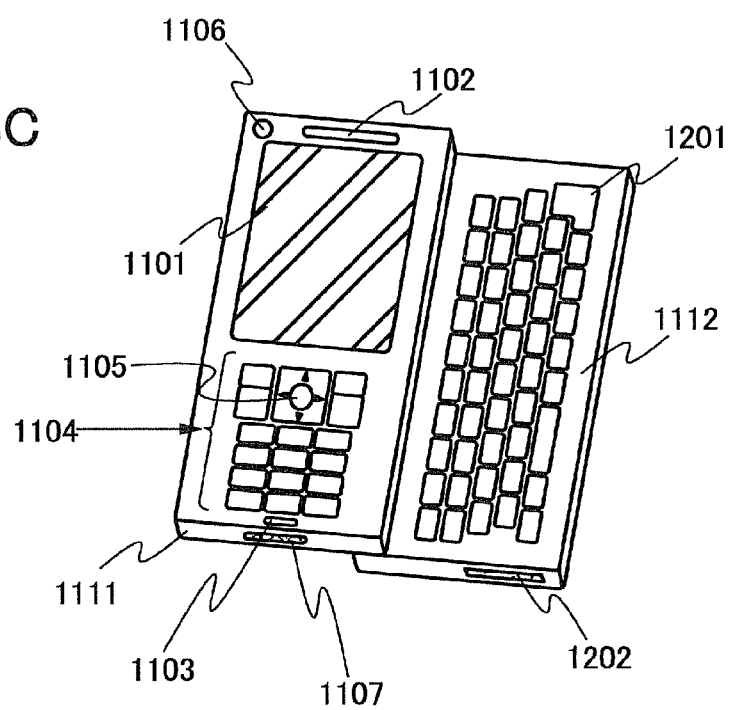

FIGS. 18A to 18C illustrate an example of a structure of a smartphone to which the present invention is applied. FIG. 18A is a front view, FIG. 18B is a rear view, and FIG. 18C is a development view. The smartphone has two housings 1111 and 1112. The smartphone has both a function of a cellular phone and a function of a portable information terminal, and incorporates a computer which is provided to conduct a variety of data processing in addition to verbal communication (voice calls); therefore, it is called a smartphone.

The smartphone has the two housings 1111 and 1112. The housing 1111 includes a display portion 1101, a speaker 1102, a microphone 1103, operation keys 1104, a pointing device 1105, a front camera lens 1106, a jack 1107 for an external connection terminal, an earphone terminal 1108, and the like, while the housing 1112 includes a keyboard 1201, an external memory slot 1202, a rear camera 1203, a light 1204, and the like. In addition, an antenna is incorporated in the housing 1111.

Further, in addition to the above structure, the smartphone may incorporate a non-contact IC chip, a small-size memory device, or the like.

The housing 1111 and the housing 1112 which are put together to be lapped with each other (FIG. 18A) are opened by sliding as illustrated in FIG. 18C. In the display portion 1101, the display device described in any of Embodiments 1 to 7 can be incorporated, and a display direction can be changed as appropriate depending on a use mode. Because the front camera lens 1106 is provided in the same plane as the display portion 1101, the smartphone can be used as a videophone.

The speaker 1102 and the microphone 1103 can be used for videophone, recording, playback, and the like without being limited to verbal communication. With the use of the operation keys 1104, operation of incoming and outgoing calls, input of simple information such as electronic mails, scrolling of a screen, cursor motion, and the like are possible.

If much information is needed to be treated, such as documentation, use as a portable information terminal, and the like, the keyboard 1201 is useful. Further, when the housing 1111 and the housing 1112 which are put together to be lapped with each other (FIG. 18A) are opened by sliding as illustrated in FIG. 18C, and used as a portable information terminal, smooth operation can be conducted by using the keyboard 1201 or the pointing device 1105. The jack 1107 for an external connection terminal can be connected to an AC adapter and a variety of cables such as a USB cable, and charging and data communication with a personal computer or the like are possible. Moreover, a larger amount of data can be stored and moved by inserting a storage medium into the external memory slot 1202.

In the rear surface of the housing 1112 (FIG. 18B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

By employing the display device described in any of Embodiments 1 to 7, mass productivity can be increased.

This application is based on Japanese Patent Application Serial No. 2008-068480 filed with Japan Patent Office on Mar. 17, 2008, the entire contents of which are hereby incorporated by reference.

What is claimed is:

1. A method for manufacturing a semiconductor device, comprising the steps of:
    introducing a first reaction gas into a reaction chamber;
    applying a high-frequency power with a frequency of greater than or equal to 30 MHz and less than or equal to 300 MHz to an upper electrode of the reaction chamber to generate glow discharge plasma;
    depositing a microcrystalline semiconductor film over a substrate disposed over a lower electrode of the reaction chamber;
    introducing a second reaction gas into the reaction chamber;
    applying a high-frequency power with a frequency of greater than or equal to 30 MHz and less than or equal to 300 MHz to the upper electrode to generate glow discharge plasma; and
    stacking an amorphous semiconductor film over the microcrystalline semiconductor film.

2. A method for manufacturing a semiconductor device, comprising the steps of:
    introducing a reaction gas into a reaction chamber;
    applying a first high-frequency power with a first frequency of greater than or equal to 3 MHz and less than 30 MHz and a second high-frequency power with a second frequency of greater than or equal to 30 MHz and less than or equal to 300 MHz, which are superposed on each other, to an upper electrode of the reaction chamber to generate glow discharge plasma;
    depositing a microcrystalline semiconductor film over a substrate disposed over a lower electrode of the reaction chamber;
    introducing hydrogen into the reaction chamber after depositing the microcrystalline semiconductor film; and
    applying a third high-frequency power with a third frequency of greater than or equal to 30 MHz and less than or equal to 300 MHz to the upper electrode to perform plasma treatment on the microcrystalline semiconductor film.

3. The method for manufacturing a semiconductor device according to claim 2, wherein a pressure in the reaction chamber before the reaction gas is introduced is in the range of $1 \times 10^{-8}$ Pa to $1 \times 10^{-4}$ Pa.

* * * * *